United States Patent
Cloutier et al.

(10) Patent No.: US 12,422,485 B2
(45) Date of Patent: Sep. 23, 2025

(54) APPARATUS AND METHOD FOR DETECTING A LIQUID CONTAMINANT IN A ROTATING CAVITY OF AN ELECTRIC MACHINE

(71) Applicant: VIBROSYSTM INC., Longueuil (CA)

(72) Inventors: Marius Cloutier, Longueuil (CA); André Brunelle, Longueuil (CA)

(73) Assignee: VIBROSYSTM INC., Longueuil (CA)

( * ) Notice: Subject to any disclaimer, the term of this patent is extended or adjusted under 35 U.S.C. 154(b) by 197 days.

(21) Appl. No.: 18/255,734

(22) PCT Filed: Dec. 2, 2021

(86) PCT No.: PCT/CA2021/051717
§ 371 (c)(1),
(2) Date: Jun. 2, 2023

(87) PCT Pub. No.: WO2022/115949
PCT Pub. Date: Jun. 9, 2022

(65) Prior Publication Data
US 2024/0003975 A1    Jan. 4, 2024

Related U.S. Application Data

(60) Provisional application No. 63/221,560, filed on Jul. 14, 2021, provisional application No. 63/121,512, filed on Dec. 4, 2020.

(51) Int. Cl.
*G01R 31/34*    (2020.01)
*F03B 13/10*    (2006.01)
*H02K 7/18*    (2006.01)
*H02K 11/20*    (2016.01)

(52) U.S. Cl.
CPC .............. *G01R 31/34* (2013.01); *F03B 13/10* (2013.01); *H02K 7/1823* (2013.01); *H02K 11/20* (2016.01)

(58) Field of Classification Search
CPC . G01R 31/34; H02K 7/14; H02K 7/18; H02K 11/20; F03B 13/10
See application file for complete search history.

(56) References Cited

FOREIGN PATENT DOCUMENTS

BR    200903604 A2    7/2012
JP    2007174755    *    7/2007    ............. Y02T 10/64

* cited by examiner

*Primary Examiner* — Neel D Shah
(74) *Attorney, Agent, or Firm* — Alexandre Daoust; Norton Rose Fulbright Canada LLP

(57) ABSTRACT

The apparatus can be used for detecting a liquid contaminant in a rotating cavity of an electric machine. The apparatus can have a magnetic field source mounted to a non-rotary base and transmitting a magnetic field across a gap between the base a housing of the cavity, an interrogation circuit having a coil magnetically coupled to the magnetic field source across the gap via the magnetic field, and a distal circuit portion having electrical contacts separated by a spacing fluidly communicating with the cavity; and a detection circuit mounted to the base and having a coil magnetically coupled to the magnetic field and a detector detecting a variation occurring in the detection circuit upon change of a permittivity of the liquid across the spacing, the variation being indicative of the liquid contaminant.

19 Claims, 14 Drawing Sheets

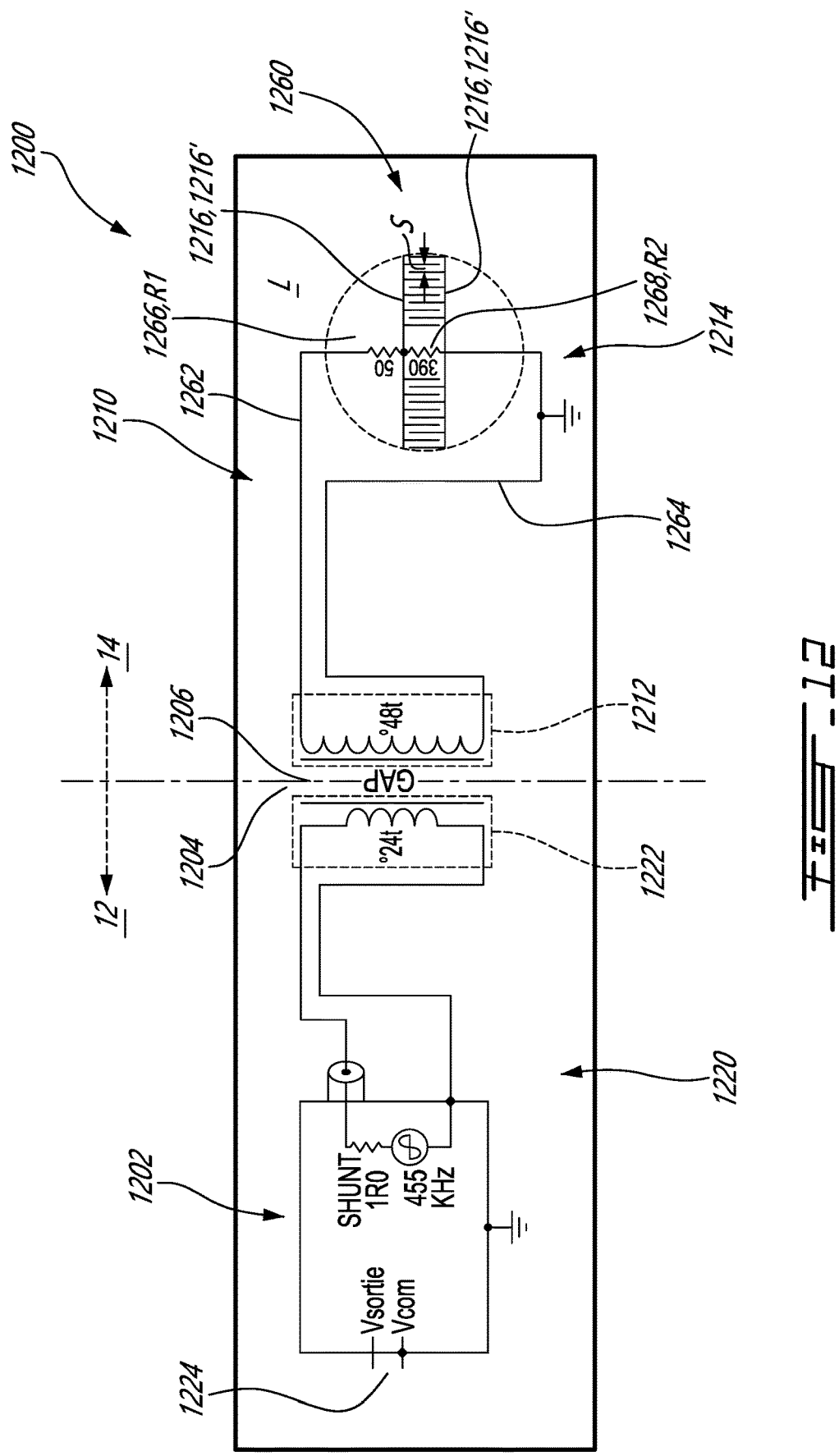

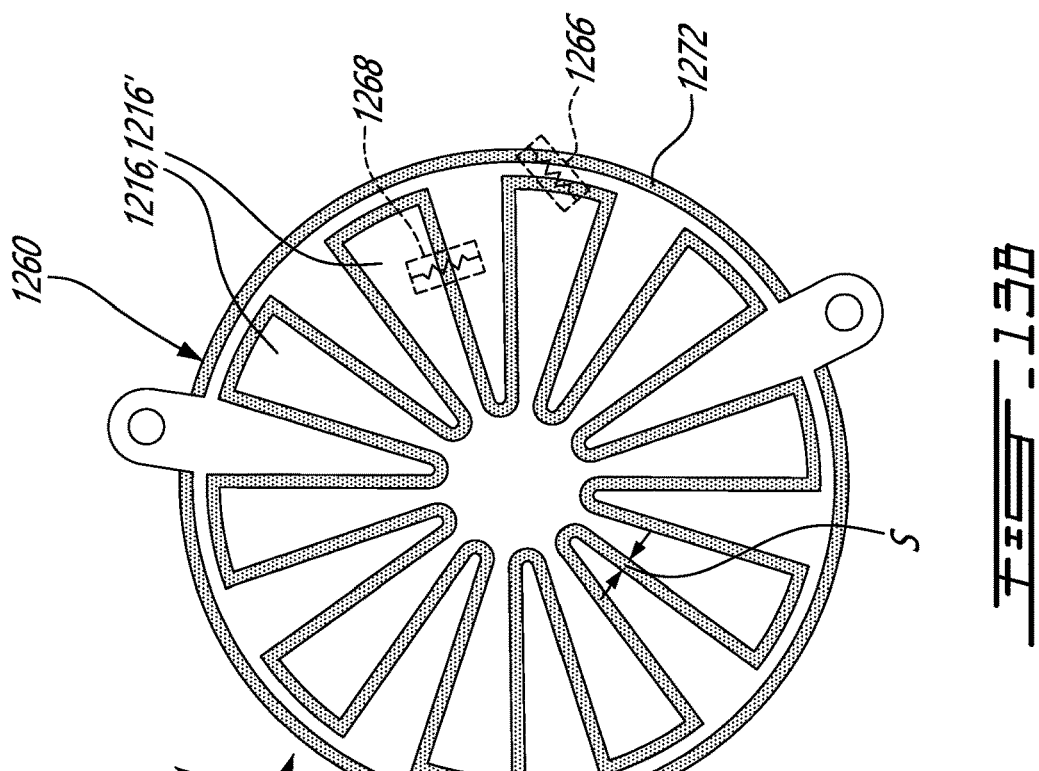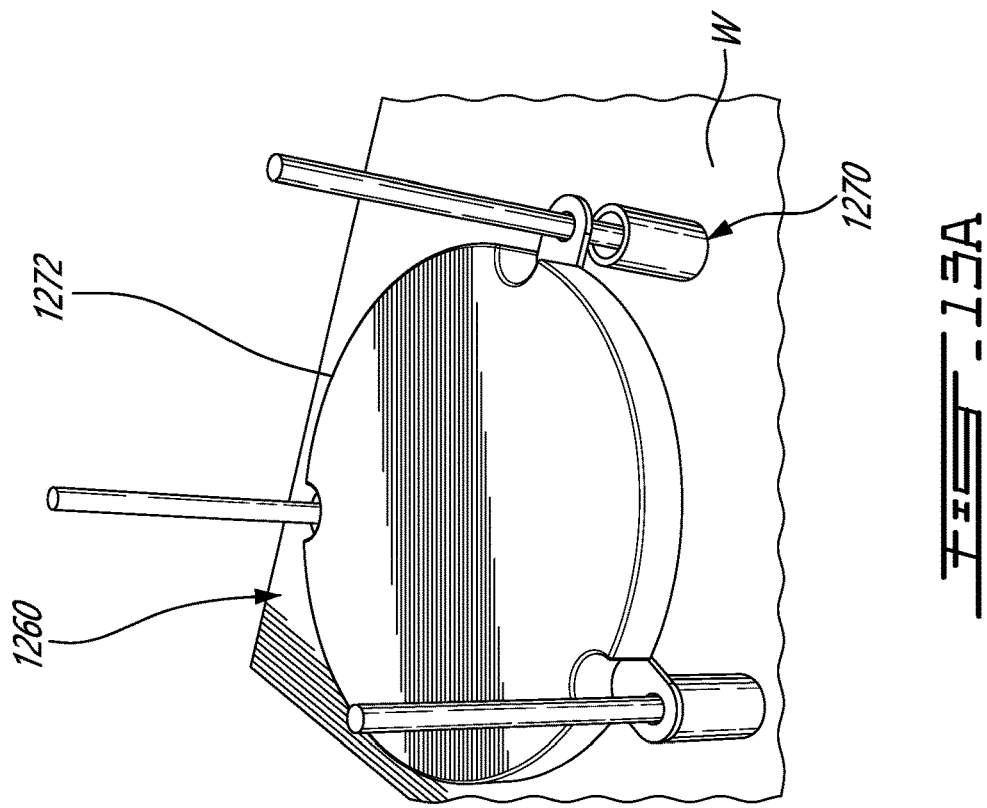

APPARATUS AND METHOD FOR DETECTING A LIQUID CONTAMINANT IN A ROTATING CAVITY OF AN ELECTRIC MACHINE

FIELD

The improvements generally relate to industrial grade, e.g. MW-range, electric machines such as mills in the mining industry and hydroelectric generators, and more specifically to liquid contaminant infiltration detection therein.

BACKGROUND

Electric machines can operate either in generator mode to produce electricity from mechanical work, or in motor mode, to produce mechanical work from electricity, and in the context of MW-range industrial applications, electric machines are typically designed specifically for one of these modes, even though electric machines otherwise share many common features, such having both a fixed part (referred to as "stator"), and a rotating part ("rotor") which is rotatably mounted to the stator. Some of these electric machines have a cavity provided as part of the rotor. Such a cavity can be designed to be filled with a fluid. For instance, in some cases, the cavity can be designed to remain full of air, whereas in other cases such a cavity can be designed to remain full of oil, and a seal may be present to prevent fluid exchange with the surroundings and can thus be referred to as a fluid reservoir.

In some cases, the rotor may operate in liquid surroundings, such as underwater or in a muddy environment, and seal deterioration over time can lead to infiltration of liquid from the liquid surroundings, referred to here as a liquid contaminant, into the cavity, and constitute an undesirable outcome. Mud infiltrating an air-filled cavity can lead to bearing deterioration for instance, whereas water infiltrating an oil-filled cavity may lead to pressure reversal and exuding oil to the surroundings for instance. There remained challenges to be addressed in terms of providing practical detection ability of a contaminant liquid in a rotaty fluid reservoir of an electric machine and allow early detection ability of such undesirable outcomes. Indeed, power plants or mining facilities can have a plurality of large electric machines, and the larger (e.g. greater power) the electric machine, the higher are the costs associated to its downtime and/or repair costs and it can be increasingly desirable to minimize downtime and/or repair costs, and/or otherwise coordinate for planned downtime as a function of the state of other electric machines in the power plant or mining facility.

SUMMARY

In accordance with one aspect, there is provided an electric machine comprising: a stator, a rotor rotatably coupled to said stator and having an internal cavity, a magnetic field source mounted to said stator and transmitting a magnetic field across a gap between said stator and said rotor; an interrogation circuit mounted to said rotor and having a coil magnetically coupled to said magnetic field source across said gap via said magnetic field, and a distal circuit portion having electrical contacts separated by a spacing fluidly communicating with the cavity, the interrogation circuit configured for influencing the magnetic field when a change in an impedance of said liquid occurs in the spacing; and a detection circuit mounted to said stator, the detection circuit having a coil electromagnetically coupled to said magnetic field and a detector configured for detecting the influence of the interrogation circuit on the magnetic field.

In accordance with another aspect, there is provided a method for detecting a liquid contaminant in an internal cavity of a hollow housing rotatably mounted to a base, said method comprising: transmitting a magnetic field across a gap between said base and said hollow housing; said magnetic field driving a coil in said internal cavity and circulating a current into an interrogation circuit having electrical contacts coupled to said coil and separated from one another by a spacing fluidly communicating with said internal cavity, the interrogation circuit influencing said magnetic field when a change in an impedance occurs in said spacing; and using a detection circuit mounted to said base and having a coil electromagnetically coupled to said magnetic field, detecting said influence of said interrogation circuit on said magnetic field.

In accordance with another aspect, there is provided an apparatus for detecting a liquid contaminant in an internal cavity of a hollow housing rotatably mounted to a base, said apparatus comprising: a magnetic field source mounted to said base and transmitting a magnetic field across a gap between said base and said hollow housing; an interrogation circuit having a coil magnetically coupled to said magnetic field source across said gap via said magnetic field, and a distal circuit portion having electrical contacts separated by a spacing fluidly communicating with said internal cavity, said interrogation circuit configured for influencing said magnetic field when a change in an impedance of said liquid occurs in said spacing; and a detection circuit mounted to said base and having a coil electromagnetically coupled to said magnetic field and a detector configured for detecting said influence of said interrogation circuit on said magnetic field.

In accordance with another aspect, there is provided an apparatus for assessing integrity of a turbine having a stator, a rotor rotatably coupled to said stator and having a hollow body with an internal cavity, a plurality of circular openings circumferentially distributed around said hollow body, and a corresponding plurality of blades rotatably mounted within said circular openings to rotate individually about a center of said circular openings for pitch variability, and liquid filling the cavity, said apparatus comprising: a magnetic field source mounted to said stator and transmitting a magnetic field across a gap between said stator and said rotor; an interrogation circuit mounted to said rotor and having a coil magnetically coupled to said magnetic field source across said gap via said magnetic field, and a distal circuit portion having electrical contacts separated by a spacing fluidly communicating with the cavity, the interrogation circuit configured for influencing the magnetic field when a change in an impedance of said liquid occurs in the spacing; and a detection circuit mounted to said stator and having a coil electromagnetically coupled to said magnetic field and a detector configured for detecting the influence of the interrogation circuit on the magnetic field.

In accordance with another aspect, there is provided a method for detecting a liquid contaminant in a rotary fluid reservoir rotatably mounted to a base, said method comprising: transmitting a magnetic field across a gap between said base and said rotary fluid reservoir; said magnetic field driving a coil in said rotary fluid reservoir and circulating a current into an interrogation circuit having electrical contacts coupled to said coil and separated from one another by a spacing fluidly communicating with said liquid in said rotary fluid reservoir, the interrogation circuit influencing said magnetic field when a change in an impedance of said liquid occurs in said spacing; and using a detection circuit mounted to said base and having a coil electromagnetically coupled to said magnetic field, detecting said influence of said interrogation circuit on said magnetic field.

In accordance with still another aspect, there is provided an apparatus for detecting a liquid contaminant in a rotary fluid reservoir rotatably mounted to a base, said apparatus comprising: a magnetic field source mounted to said base and transmitting a magnetic field across a gap between said base and said rotary fluid reservoir; an interrogation circuit having a coil magnetically coupled to said magnetic field source across said gap via said magnetic field, and a distal circuit portion having electrical contacts separated by a spacing fluidly communicating with said liquid in said rotary fluid reservoir, said interrogation circuit configured for influencing said magnetic field when a change in an impedance of said liquid occurs in said spacing; and a detection circuit mounted to said base and having a coil electromagnetically coupled to said magnetic field and a detector configured for detecting said influence of said interrogation circuit on said magnetic field.

In an aspect of the present disclosure, there is described an apparatus to detect leaks in Kaplan-type turbines. Indeed, in some situations, the seals can wear over time which can undesirably lead to water infiltration, a liquid contaminant, into the turbine's hollow body. Due to the difference in density between water and oil for instance, the water can settle at the bottom of the hollow body. When a given amount of water has infiltrated the cavity of the turbine, a reversal of pressure can occur and cause the lubricating liquid to exude from the cavity, and therefore towards the water source, as water becomes the predominating liquid in the hollow body of the turbine. It was found that water infiltration in such turbines can be an early contamination indicator, and that even if the infiltrated water appears to be low, e.g., only 15 gallons in a 1500 gallons hollow body, detecting the contamination early can help prevent oil leaking into the source of water.

The apparatus can generally have a magnetic field source mounted to the stator and transmitting a magnetic field across a gap between the stator and the rotor. An interrogation circuit is mounted to the rotor, and provided with a rotor-side coil magnetically coupled to the magnetic field source across the gap via the magnetic field. The interrogation circuit also has a distal circuit portion with electrical contacts separated by a spacing filled with the lubricating liquid in the rotor during normal operating conditions. The apparatus has a detection circuit mounted to the stator. The detection circuit has a stator-side coil magnetically coupled to the magnetic field source and an impedance detector detecting a variation occurring in the detection circuit upon change of impedance in the fluid filling the spacing. The change can stem from a change in permittivity or a change in resistivity, typically both, and the detection circuit can be specifically adapted to detect changes in current flow stemming from the change in impedance. In the case of a change of the liquid from oil to water, the change of resistivity may produce a stronger signal than a change in permittivity, for instance, though in some embodiments, the change in permittivity may still be detectable. The variation affecting the detection circuit can be indicative of a leak in the turbine.

Many further features and combinations thereof concerning the present improvements will appear to those skilled in the art following a reading of the instant disclosure.

DESCRIPTION OF THE FIGURES

In the figures,

FIG. 6A is a top plan view of the apparatus of FIG. 7, showing a fixed coil and a rotating coil, in accordance with one or more embodiments;

FIG. 12 is a schematic view of another example of an apparatus for detecting a leak in a Kaplan-type turbine, showing an exemplary distal circuit portion incorporating first and second resistors, in accordance with one or more embodiments;

FIG. 13A is an oblique view of the distal circuit portion of FIG. 12, showing an outside face thereof, in accordance with one or more embodiments;

FIG. 13B is an oblique view of the distal circuit portion of FIG. 12, showing an inside face thereof, in accordance with one or more embodiments.

DETAILED DESCRIPTION

Figure 1A:
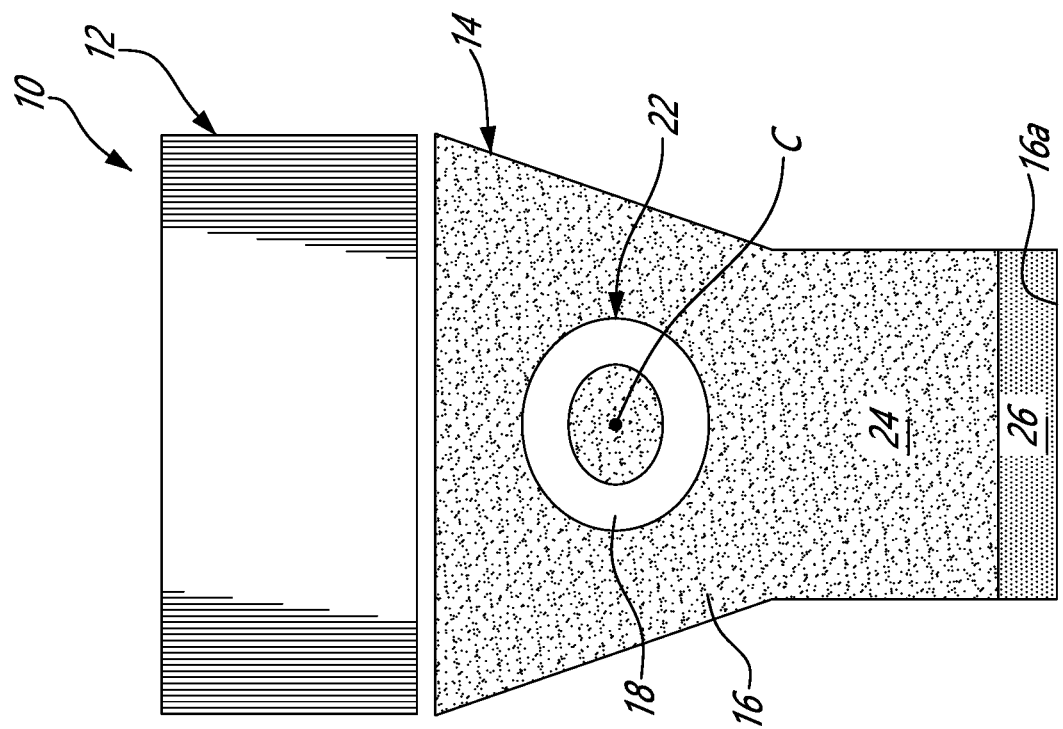
FIG. 1A is a schematic view of the Kaplan-type turbine of FIG. 1, in accordance with the prior art.
Figure 1:
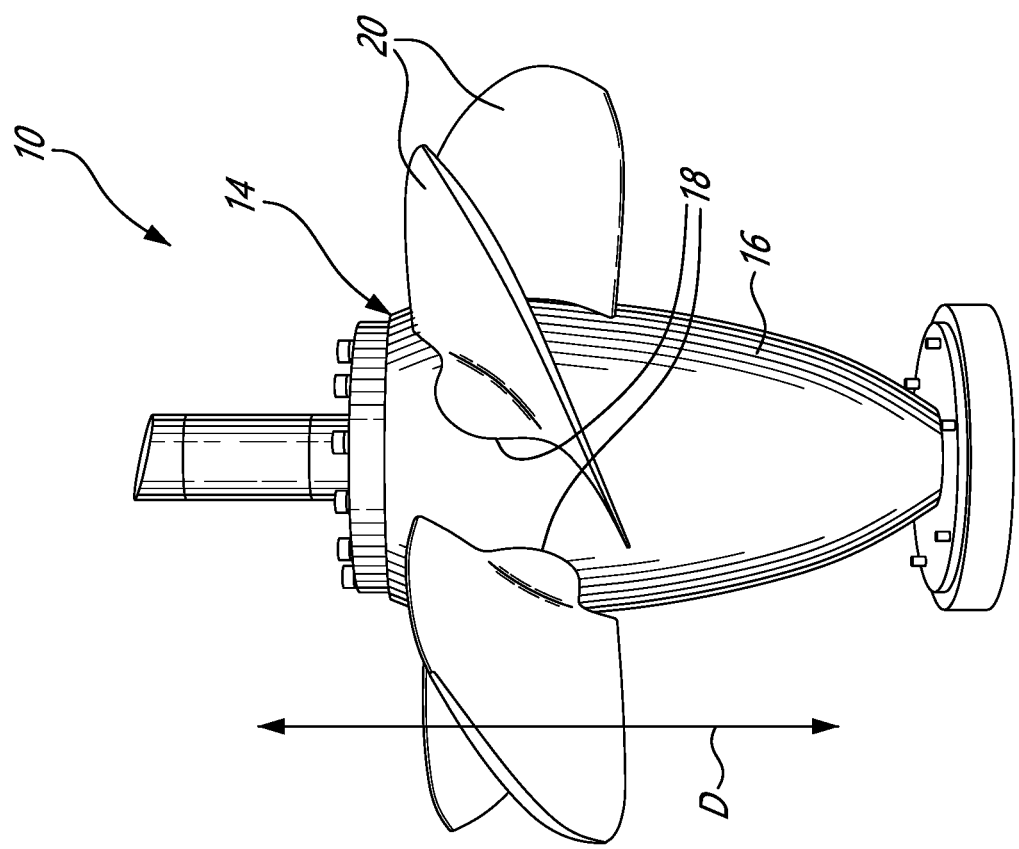
FIG. 1 is side elevation view of an example of a Kaplan-type turbine, in accordance with the prior art.

FIGS. 1 and 1A show an example electric machine which, in this embodiment, is embodied as a generator. More specifically, the example electric machine is a Kaplan-type turbine 10, in accordance with the prior art. As depicted, the Kaplan-type turbine has a stator 12, a rotor 14 which is rotatably coupled to the stator 12 and which rotation can be driven by an incoming flow of liquid along orientation O. The rotor 14 has a hollow body 16, circular openings 18 circumferentially distributed around the hollow body 16, and a corresponding number of blades 20 sealingly mounted to the circular openings 18 via seals such as sealing rings 22. The blades 20 are actuatable to rotate individually about a center C of the corresponding circular openings 18 which can correspondingly increase or decrease a pitch of the blades 20 as desired as a function of the incoming flow of liquid, which may not be constant over time. As shown, the hollow body 16 is filled with a liquid 24 lubricating (hereinafter "lubricating liquid 24") the rotation mechanism, and more specifically oil.

If the sealing rings 22 deteriorate past a certain point over time, water 26 may penetrate inside the hollow body 16 via the worn sealing rings 22 and then travel towards a bottom 16a of the hollow body 16 as the density of water 24 is typically greater than that of the lubricating liquid 24, e.g., oil in this embodiment. As the water 24 gradually fills the hollow body 16, it may eventually force the lubricating liquid 24 out of the hollow body back across the worn sealing rings 22, which would contaminate the surrounding flow of water. There is therefore a need in detecting such leaks in Kaplan-type turbines allowing it to take action before the leakage reaches the stage where oil escapes from the cavity. One challenge in addressing the detection in the rotary part is that the rotary part is a somewhat inhospitable environment, with centripetal forces and oil, and using a power source such as batteries in the rotor to detect the leaks may require changing the batteries before a leak actually occurs, which would not address the objective of avoiding down time. Powering a detector located in the rotor from the stator side poses particular challenges due to the relative rotation between the rotor and the stator. Moreover, a gap is typically present between the rotor and the stator. Moreover, a gap is typically present between the rotor and the stator. The gap is configured to accommodate dimensional variations and/or potential vibrations in avoiding frictional contact between the rotor and the stator during operation.

A MW-range milling machine in the mining industry can have similar components such as an air filled rotary cavity which can operate in a muddy environment, with a gap between a stator portion and the housing of the rotary cavity, and wherein liquid such as mud from the muddy environment may undesirably infiltrate the rotary cavity upon seal wear.

Figure 2:
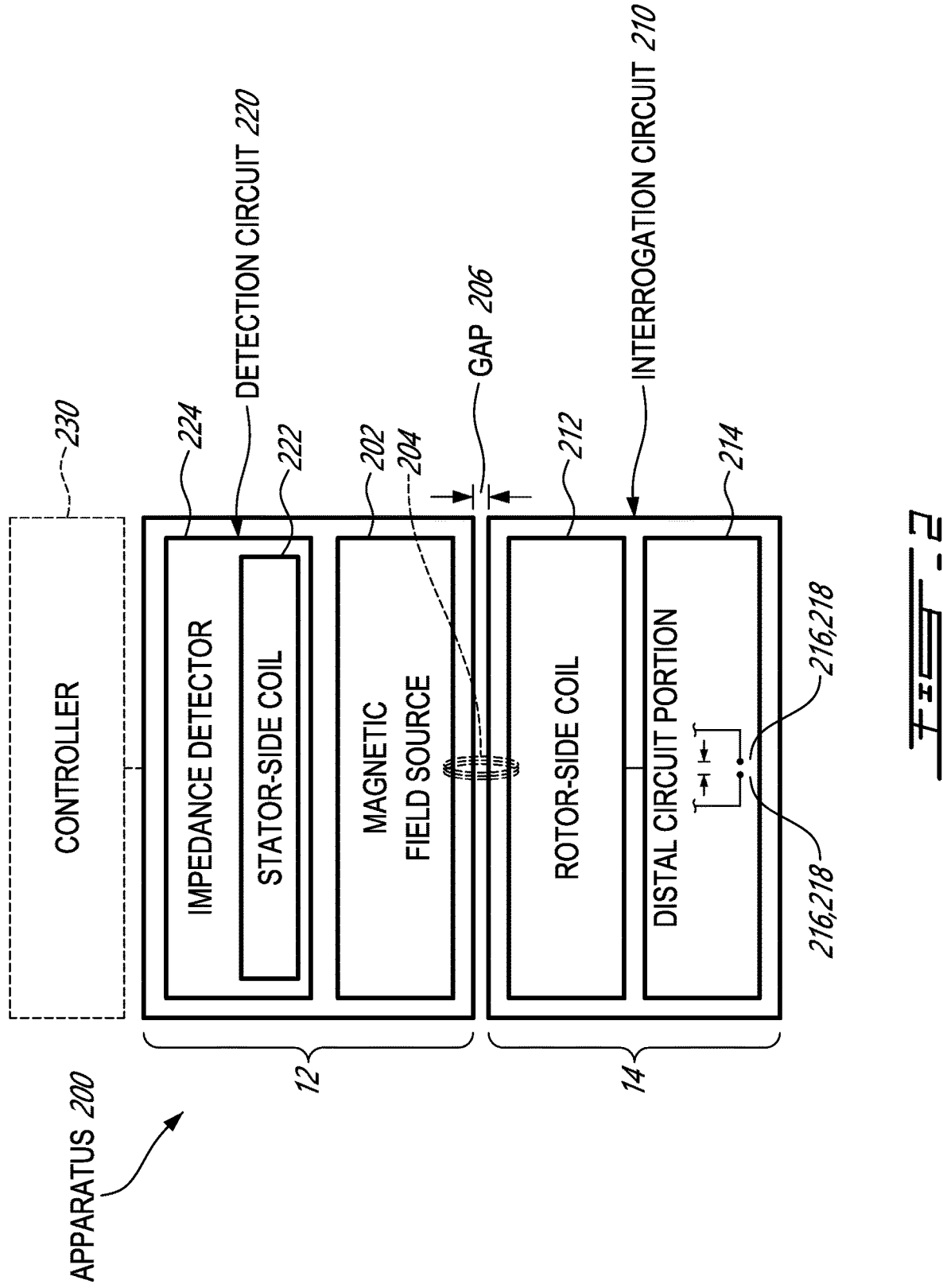
FIG. 2 is a block diagram of an example of an apparatus for detecting a leak in a Kaplan-type turbine, showing a magnetic field source, an interrogation circuit, a detection circuit and a controller, in accordance with one or more embodiments.

FIG. 2 shows an example of an apparatus 200 for detecting a liquid leak in a rotary cavity of an electric machine such as a Kaplan-type turbine or a mining mill, in accordance with an embodiment which can overcome such challenges. The apparatus can use a magnetic field to communicate power across the gap and to communicate the signal back across the gap. More specifically, the apparatus 200 has a magnetic field source 202 which is mounted to the stator 12 and which emits a magnetic field 204 across the gap 206 between the stator 12 and the rotor 14. A coil 212 is provided at the rotor side to convert the portion of the magnetic field 204 received across the gap 206 into electricity in the interrogation circuit 210 provided in the rotor. The interrogation circuit 210 includes a spacing between conductors in which the fluid can circulate. A change in impedance in the fluid can thus affect the magnetic field 204 via the coil. A detection circuit including a stator-side coil coupled to the magnetic field 204 can be used to detect the effect of a change of impedance on the magnetic field 204, and generate a signal indicative of a leakage, for instance. Depending on the embodiment, the magnetic field source 202 can stem from a current circulated in the stator-side coil 222, or from a permanent magnet surrounded by the stator-side coil 222, to name two examples.

The gap 206 can be planar and transversal to the orientation of the rotor's rotation axis. In other words, the gap 206 can extend both radially and circumferentially. The axial dimension of gap 206 between the rotor and the stator, and more specifically the axial dimension between the magnetic field source 202 and the rotor-side coil, which may need to be larger than the dimension of the gap 206 due to practical considerations, will significantly affect the perceived strength of the magnetic field 204 by the rotor-side coil 212. On the other hand, the size of the gap can be driven by the turbine manufacturer which may want to ensure that it is sufficient to accommodate dimensional tolerances and vibrations during operation. Depending on the embodiment, the gap 206 may be below 20 mm or below 15 mm, preferably less. It is somewhat typical for Kaplan turbine applications for the gap to be between 1 mm and 20 mm, or between 2 mm and 15 mm, for instance. As will be demonstrated with examples further below, it was found that it was possible to achieve a detectable signal across such dimensions of gaps.

The magnetic field source 202 can differ from one embodiment to another, for instance considering the thickness of the gap, the thickness of the stator and rotor's walls, the overall footprint of the Kaplan-type turbine and the like. In some embodiments, the magnetic field source 202 can include one or more electromagnets, with a stator-side coil driven by an alternating current (AC) source or a direct current (DC) source. The magnetic field source 202 can be provided in the form of an alternator or a transformer in some embodiments. Additionally or alternatively, the magnetic field source 202 may include one or more permanent magnets. The magnetic field source 202 can include one or more crenels made of ferromagnetic material which are disposed strategically with respect to the permanent magnets and/or to the electromagnets to guide the magnetic field lines across the gap 206 where desired, also referred to in the art as closing the magnetic circuit. Non-limiting examples of such magnetic field sources 202 are described below.

The interrogation circuit 210 can have a distal circuit portion 214 with electrical contacts 216 separated by a spacing S filled with liquid operation of the turbine. The location of the electrical contacts 216, and thus of the spacing S, can be specifically selected in a manner that the spacing S would be filled with oil in the absence of a leakage, but could instead be filled with water in the event of a leakage, and preferably before the inflow of water would cause inversion of pressure and oil leakage out from the cavity. In some embodiments, the electrical contacts 216 are provided in the form of two conductive plates 218 facing each other and spaced by the spacing S. In some other embodiments, the distal circuit portion 214 has an electrical cable having a signal conductor and a ground conductor surrounding the ground conductor and electrically insulated therefrom, with distal ends of the signal and ground conductors being exposed and acting as the electrical contacts 216. Other example of such electrical contacts 216 can be used in some other embodiments. As can be appreciated, the interrogation circuit 210 can be referred to as a RLC circuit which can have resonance at a predetermined frequency. While the resistor R may be defined by the conductivity of the wires of the circuit, the inductor L is defined by the rotor-side coil 212 (e.g., number of turns, turn diameter, wire diameter), the capacitor C is defined by the electrical contacts 216 and its surrounding environment including the liquid filling the spacing S between the electrical contacts 216. In such embodiments, it is noted that the resonance frequency of the RLC circuit can be preferably avoided.

As such, it is expected that the rotor-side coil 212, the electrical contacts 216 and the liquid-filled spacing S therebetween collectively form a circuit across a current is circulated when the rotor-side coil 212 is magnetically coupled to and excited by the magnetic field source 202 via the magnetic field 204. As the impedance of the liquid filling the spacing S can have an influence on one or more electrical properties of the interrogation circuit 210 including, but not limited to, an inductive impedance, a capacitive impedance, a resistive impedance and the like, the impedance of the liquid filling the spacing S may in turn have an influence on a magnetic field reflected by the rotor-side coil 212 back across the gap 206 as that current is flowed thereacross. As the permittivity of the lubricating fluid is not expected to change over time, the reflected magnetic field is not expected to significantly change under normal operating conditions. However, a liquid contaminant of a differing permittivity leaking into the spacing S across the electrical contacts 216 would change the impedance of the interrogation circuit 210 and thus the reflected magnetic field.

To detect this change, a detection circuit 220 is mounted to the stator 12 across the gap 206. As depicted, the detection circuit 220 has a stator-side coil 222 which is magnetically coupled to the magnetic field 204 and, in this example, an impedance detector 224 configured for detecting a variation of impedance occurring in the detection circuit 220 upon change of a permittivity of the liquid across the spacing S. The variation of impedance can be a variation from a reference impedance of the interrogation circuit 210 generally measured when the lubricating liquid is present across the electrical contacts 216. In some embodiments, the impedance detector 224 outputs an impedance value such as an instantaneous impedance value, an averaged impedance value and the like. In some other embodiments, the impedance detector 224 is omitted and replaced with a current or voltage detector to detect any other type of electrical variation that can occur across the detection circuit 220.

In some embodiments, the apparatus 200 has a controller 230 which is communicatively coupled to the impedance detector 224. The controller 230 generally has a processor and a memory having stored thereon instructions that when executed by the processor perform one or more predetermined steps. For instance, the controller 230 can generate an alert upon determining that the detected variation of impedance is of at least 10 percent, at least 20 percent or at least 30 percent, to name some possible examples. In some embodiments, the alert may be indicative that the lubricating liquid has changed from a first liquid, e.g., oil, to a second liquid, e.g., water, upon determining that the variation of impedance is above a predetermined threshold. The controller 230 can store the alert(s), and their respective timings in memory(ies), communicate them to nearby device(s) and/or transmit them via one or more communication network(s).

The controller 230 can be provided as a combination of hardware and software components. The hardware components can be implemented in the form of a computing device 300, an example of which is described with reference to FIG. 3. The software components can be implemented in the form of a software application which can be run by the controller 230. The software application can be expressed in any suitable software language, depending on the embodiment.

In some embodiments, the software application is configured to fetch calibration data usable in the determination of whether a water leak, or any other contaminating leak, is present across the electrical contacts based on the measured impedance value or variation thereof.

Figure 3:
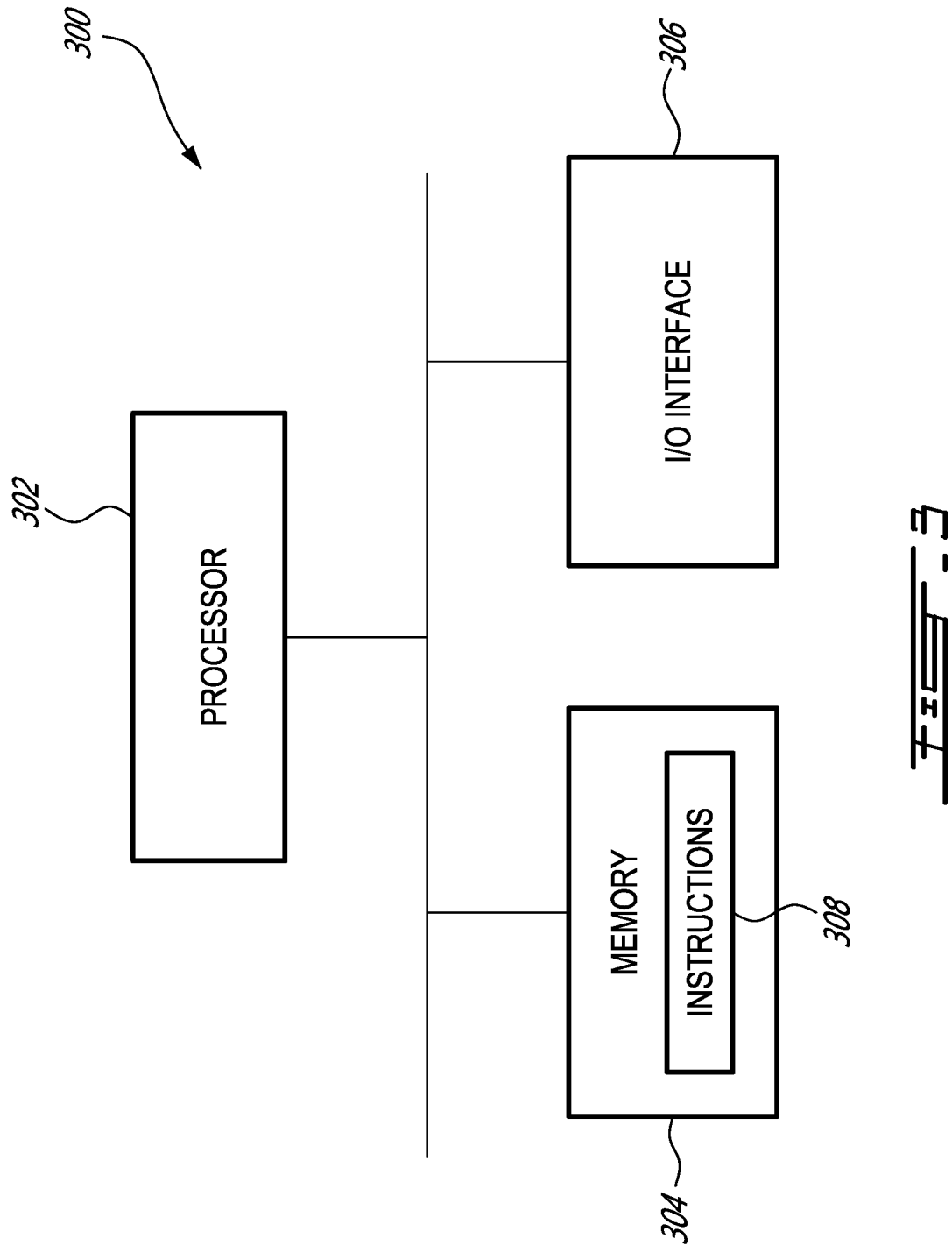
FIG. 3 is a schematic view of an example of a computing device of the controller of FIG. 2, in accordance with one or more embodiments.

Referring to FIG. 3, the computing device 300 has a processor 302, a memory 304, and I/O interface 306. Instructions 308 for executing the above-discussed software for detecting a leak or a variation of impedance in a liquid can be stored on the memory 304 and accessible by the processor 302.

The processor 302 can be, for example, a general-purpose microprocessor or microcontroller, a digital signal processing (DSP) processor, an integrated circuit, a field programmable gate array (FPGA), a reconfigurable processor, a programmable read-only memory (PROM), or any combination thereof.

The memory 304 can include a suitable combination of any type of computer-readable memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like.

Each I/O interface 306 enables the computing device 300 to interconnect with one or more input devices, such as button(s) or actuator(s) controlling parameters of the magnetic field source(s) or other components of the apparatus 200, or with one or more output devices such as memory(ies) or remote network(s).

Each I/O interface 306 enables the controller 230 to communicate with other components, to exchange data with other components, to access and connect to network resources, to server applications, and perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), electrical cable, fiber optics, satellite, mobile, wireless (e.g. Wi-Fi, WiMAX), SS7 signaling network, fixed line, local area network, wide area network, and others, including any combination of these.

In some embodiments, the instructions 308 can be stored on the memory 304 and accessible by the processor 302 of the computing device 300. The controller can be communicatively coupled to the magnetic field source to control an amplitude and/or a frequency of the magnetic field as desired. The computing device 300 may be mounted to the stator and provided with a communication unit to communicate information to external device(s) or network(s). In some other embodiments, the computing device 300 is external to the stator and to the turbine, and is in wired and/or wireless communication with the detector of the detection circuit, the magnetic field source and the like. The computing device 300 and any associated software application are meant to be examples only. Other suitable embodiments of the controller 230 can also be provided, as it will be apparent to the skilled reader.

Figure 4:
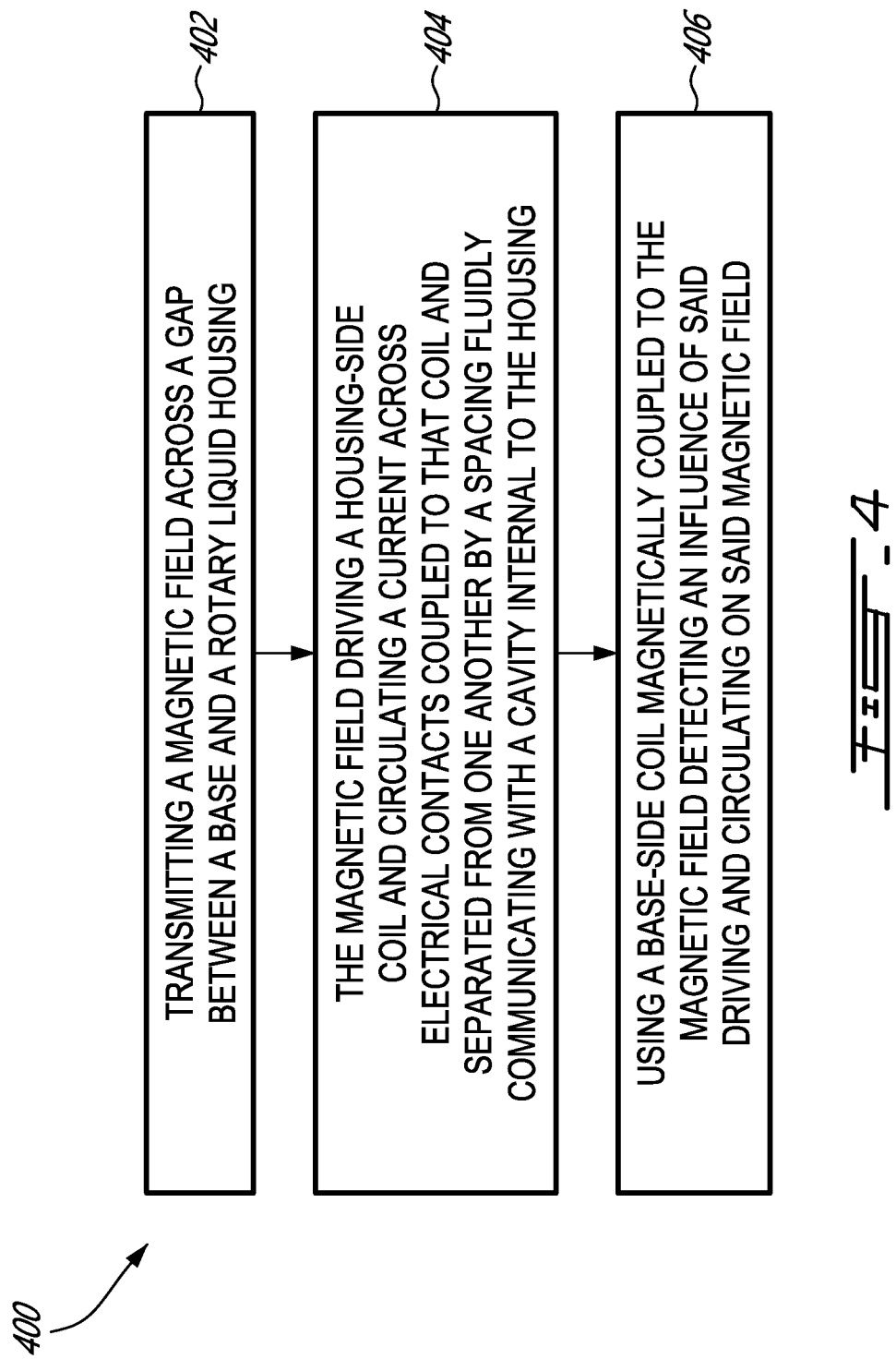
FIG. 4 is a flowchart of an example of a method for detecting a leak in a Kaplan-type turbine, in accordance with one or more embodiments.

Referring now to FIG. 4, there is described a flowchart of a method 400 for detecting a liquid contaminant in a rotary fluid reservoir rotatably mounted to a base. It is noted that although the apparatus 200 described with reference to FIG. 2 has been described with reference to a stator and a rotor of a turbine, the apparatus 200 can be used in any other non-turbine related contexts encompassing a base and a rotary fluid reservoir being rotatably mounted to the base. For instance, in mining applications, the rotary fluid reservoir may be part of a mill and the liquid contaminant may be mud instead of water. Other applications of the apparatus and method described herein may apply.

At step 402, a magnetic field source transmits a magnetic field across a gap between the base and the rotary fluid reservoir. In some embodiments, step 402 is performed by driving an alternating current across a coil of the base proximate to the gap. In some other embodiments, step 402 is performed by mounting a permanent magnet to the base and proximate to the gap. In the latter embodiments, an alternating component to the AC and DC current can be added thanks to the rotary nature of the rotary fluid reservoir. Accordingly, in some embodiments, the magnetic field source includes an alternator, a transformer, and the like.

At step 404, the magnetic field drives a coil in the rotary fluid reservoir and thereby circulates a current into an interrogation circuit having electrical contacts coupled to the coil and separated from one another by a spacing fluidly communicating with a liquid in the rotary fluid reservoir. The interrogation circuit is configured for influencing the magnetic field when a change in an impedance of the liquid occurs in the spacing.

At step 406, a detection circuit being mounted to the base and having a coil magnetically coupled to the magnetic field detects an influence of the interrogation circuit on the magnetic field. In some embodiments, a variation of impedance occurring in the detection circuit is detected upon change of a permittivity of the liquid across the spacing. It is noted that due to the rotary nature of the rotary fluid reservoir, the interrogation and detection circuits may face each other at a frequency which depends on a rotational speed of the rotary fluid reservoir. As such, the step 406 of detecting may be performed only at a given rotational position of the rotary fluid reservoir. In some embodiments, the step 406 of detecting includes monitoring an impedance, or variation thereof, occurring as the detection circuit is away from the interrogation circuit, and therefore measure the impedance at other rotational positions than the given rotational position at which the interrogation and detection circuits face each other. In these embodiments, doing so can help validate normal operating conditions.

In some embodiments, the method includes a step of generating an alert upon determining that the variation of impedance exceeds 10 percent, 20 percent, 30 percent, or whatever value is considered suitable and indicative of a condition to be detected in the given context. In some embodiments, the alert can be indicative that the liquid has changed from a first, lubricating liquid to a second, liquid contaminant upon determining that the variation occurring in the detection circuit is above a predetermined threshold. For instance, the predetermined threshold can be an impedance threshold, a variation of impedance threshold, a voltage threshold, a current threshold, and the like. In particular, detecting a change of capacitance of the capacitor formed by the electrical contacts and the fluid-filled spacing therebetween, when a change in permittivity occurs in the fluid, can generate a suitable signal to be detected. Alternatively, detecting a change of resistance stemming by the change of resistance of the fluid between the electrical contacts can generate a suitable signal to be detected.

Figure 5:
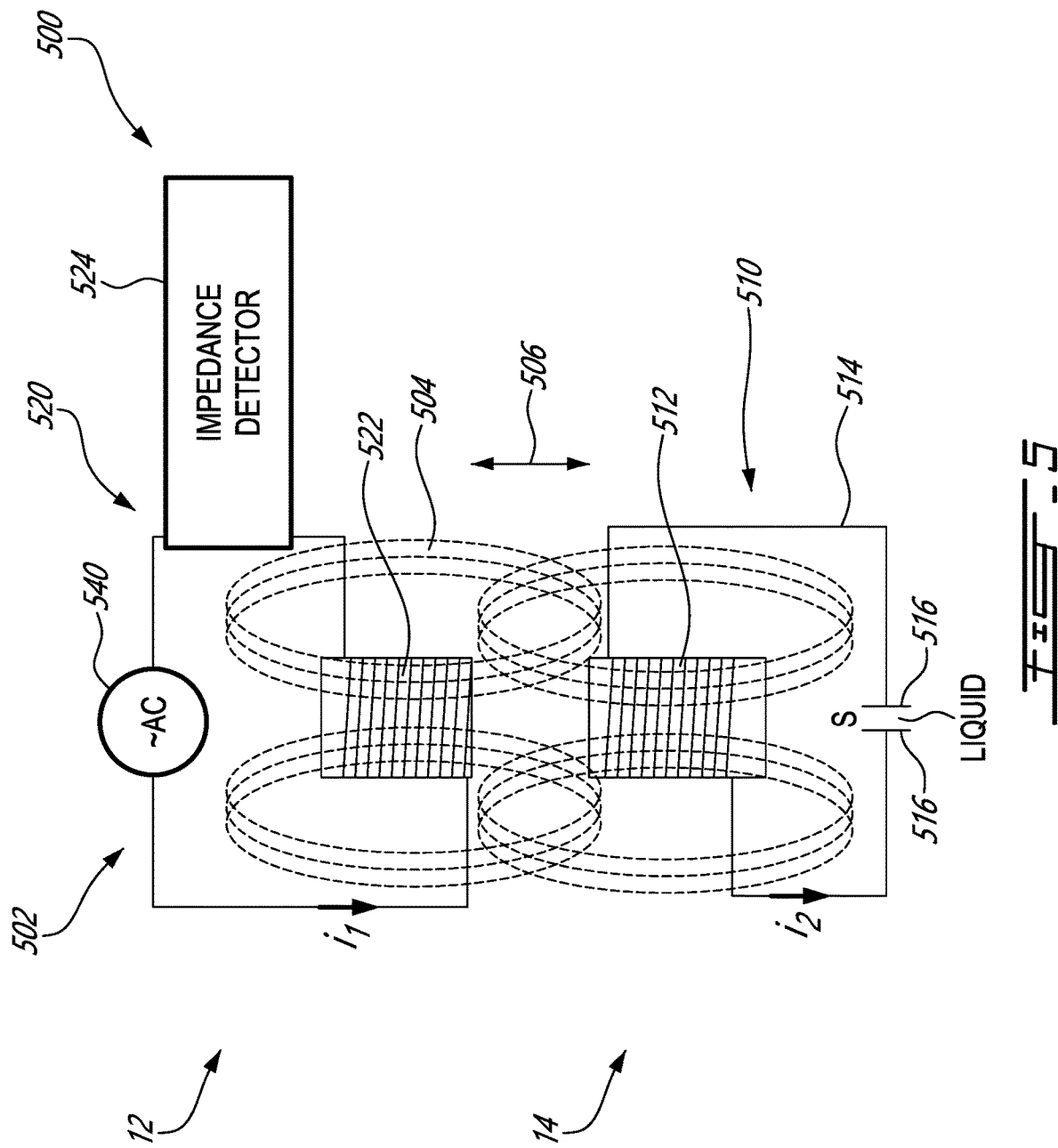
FIG. 5 is a schematic view of an example of an apparatus for detecting a leak in a Kaplan-type turbine, showing a magnetic field source, an interrogation circuit and a detection circuit, in accordance with one or more embodiments.

FIG. 5 shows an example of an apparatus 500 for detecting a leak in a rotary cavity having a stator 12, a rotor 14 rotatably coupled to the stator 12 and spaced-apart therefrom by a gap.

As shown, in this example the apparatus 500 has a magnetic field source 502 mounted to the stator 12 and transmits a magnetic field 504 across a gap 506 between the stator 12 and the rotor 14. In this specific example, the magnetic field source 502 has an AC source 540, and a stator-side coil 522 driven by the AC source 540 with an AC signal having a constant amplitude and a constant frequency. The propagation of the AC signal around the stator-side coil 522 generates the magnetic field 504. In some embodiments, the AC signal having a constant amplitude and a constant frequency is preferred as any variation occurring in the detection circuit can thereby be associated in permittivity change across the electrical contacts 516. In some other embodiments, the AC signal may have a varying amplitude and/or a varying frequency. However, in these embodiments, calibration data indicative of expected impedance values for each amplitude and frequency combinations may be used to identify the permittivity change across the electrical contacts 516.

In this embodiment, the interrogation circuit 510 is mounted to the rotor 14 and has a rotor-side coil 512 which is magnetically coupled to the magnetic field source 502 across the gap 506 via the magnetic field 504, and a distal circuit portion 514 having electrical contacts 516 separated by a spacing S filled with a liquid in the rotor 14 during normal or abnormal operating conditions. As discussed above, the magnetic field 504 picked up by the rotor-side coil 512 will cause an induced current to propagate across the interrogation circuit 510. As the liquid-filled spacing S is part of that circuit, any change in the permittivity of the liquid-filled spacing S can change one or more electrical properties of the interrogation circuit 510 and thereby modify a magnetic field that the induced current propagating through the rotor-side coil 512 can generate.

As shown, a detection circuit 520 is mounted to the stator 12. The detection circuit 520 has a stator-side coil 522 which in this embodiment is the same as the stator-side coil 522 which is part of the magnetic field source 502. The stator-side coil 522 is magnetically coupled to the magnetic field 504. An impedance detector 524 is also provided for detecting a variation of impedance occurring in the detection circuit 520 upon change of a permittivity of the liquid across the spacing S. As discussed above, the variation of impedance can be indicative of a leak in the rotor 14. In this embodiment, both the rotor-side coil 512 and the stator-side coil 522 have an axial orientation which is parallel to the thickness of the gap 506 (i.e., parallel with a vertical orientation of the page). However, it is understood that in some other embodiments, the axial orientations of the coils 512 and 522 may be perpendicular to the thickness of the gap 506 (i.e., perpendicular to the vertical orientation of the page).

It is noted that although the axial orientations of the coils 512 and 522 are shown to be vertically aligned with respect to one another, this vertical alignment may only be appreciated when the rotor 14 is at a given rotational position. Indeed, as the rotor is rotating, the interrogation and detection circuits 510 and 520 may face each other at a frequency which depends on a rotational speed of the rotor 14.

Figure 6:
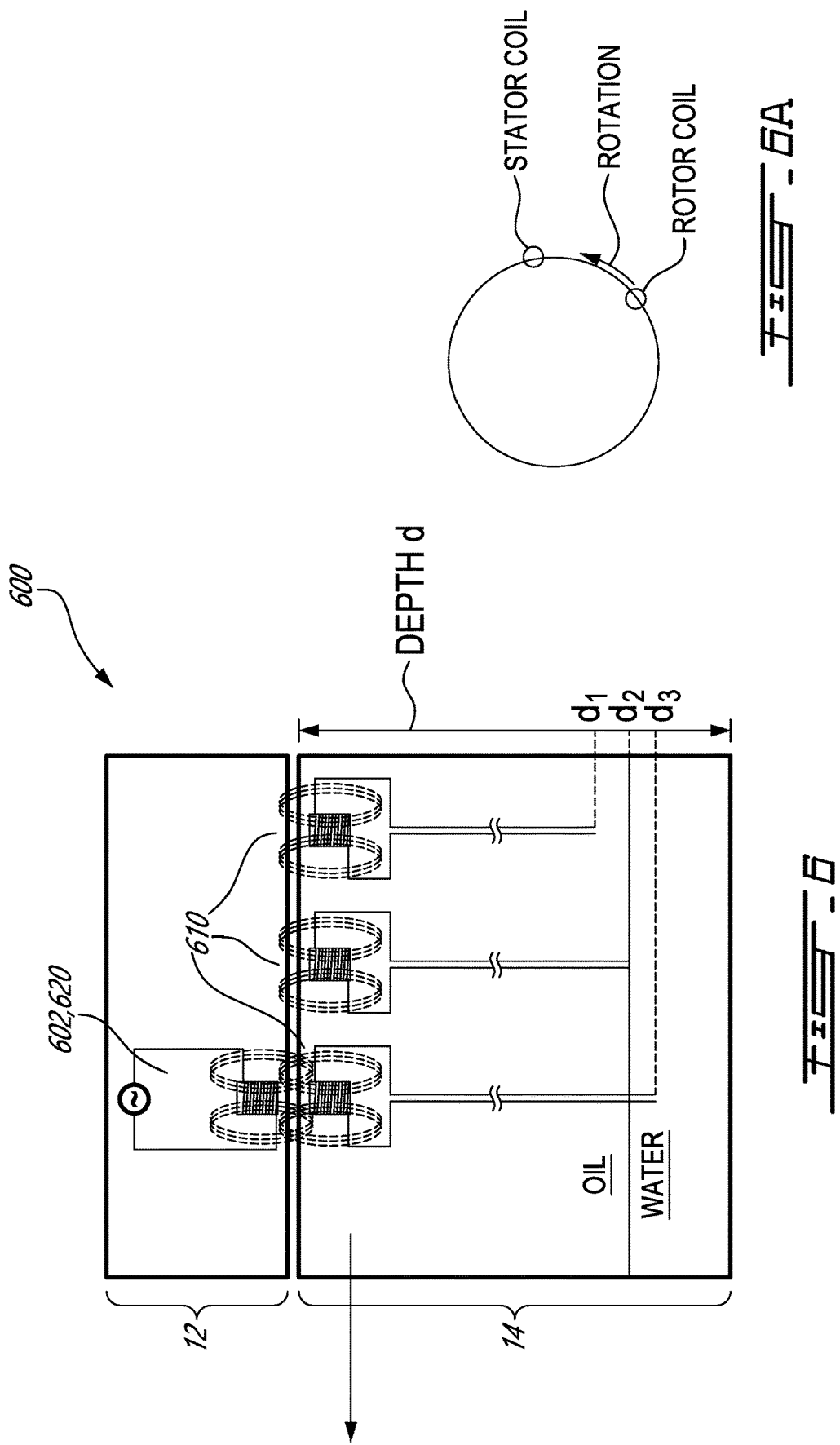
FIG. 6 is a schematic view of another example of an apparatus for detecting a leak in a Kaplan-type turbine, shown with different interrogation circuits positioned at different depths, in accordance with one or more embodiments.

FIG. 6 shows an example of an apparatus 600 for detecting a leak in a turbine 10 having a stator 12, a rotor 14 rotatably coupled to the stator 12 and spaced-apart therefrom by a gap. As depicted, the apparatus 600 has a magnetic field source 602 and a detection circuit 620 both mounted to the stator 12. As shown, the apparatus 600 has a plurality of interrogation circuits 610 each having a distal circuit portion lying at a respective depth of the rotor 14. More specifically, as shown, a first one of the distal circuit portions has electrical contacts which lie at a first depth d1, a second one of the distal circuit portions has electrical contacts which lie at a second depth d2, a third one of the distal circuit portions has electrical contacts which lie at a third depth d3, and so forth, if necessary. In this way, the degree of severity of the leak can be monitored in real time or quasi-real time. For instance, if the third distal circuit portion detects water while the second distal circuit portion detects oil, one can determine that the water level lies between the second and third depths d2 and d3. Accordingly, in such embodiments, the maintenance of a leaky rotor may be based on the measured degree of severity of the leak. For instance, if it is determined that all three interrogation circuits detect water at the same time, or within a given time period, the use of the rotor 14 may be interrupted right away for maintenance and reparation purposes.

It is noted that in the illustrated embodiment, the interrogation circuits are circumferentially spaced-apart from one another around a circumference of the rotor. Accordingly, by rotation of the rotor, successive ones of the interrogation circuits will face consecutively the detection circuit, as best shown in FIG. 6A, which may allow sequential impedance measurements at the different depths within the rotor 14.

Figure 7:
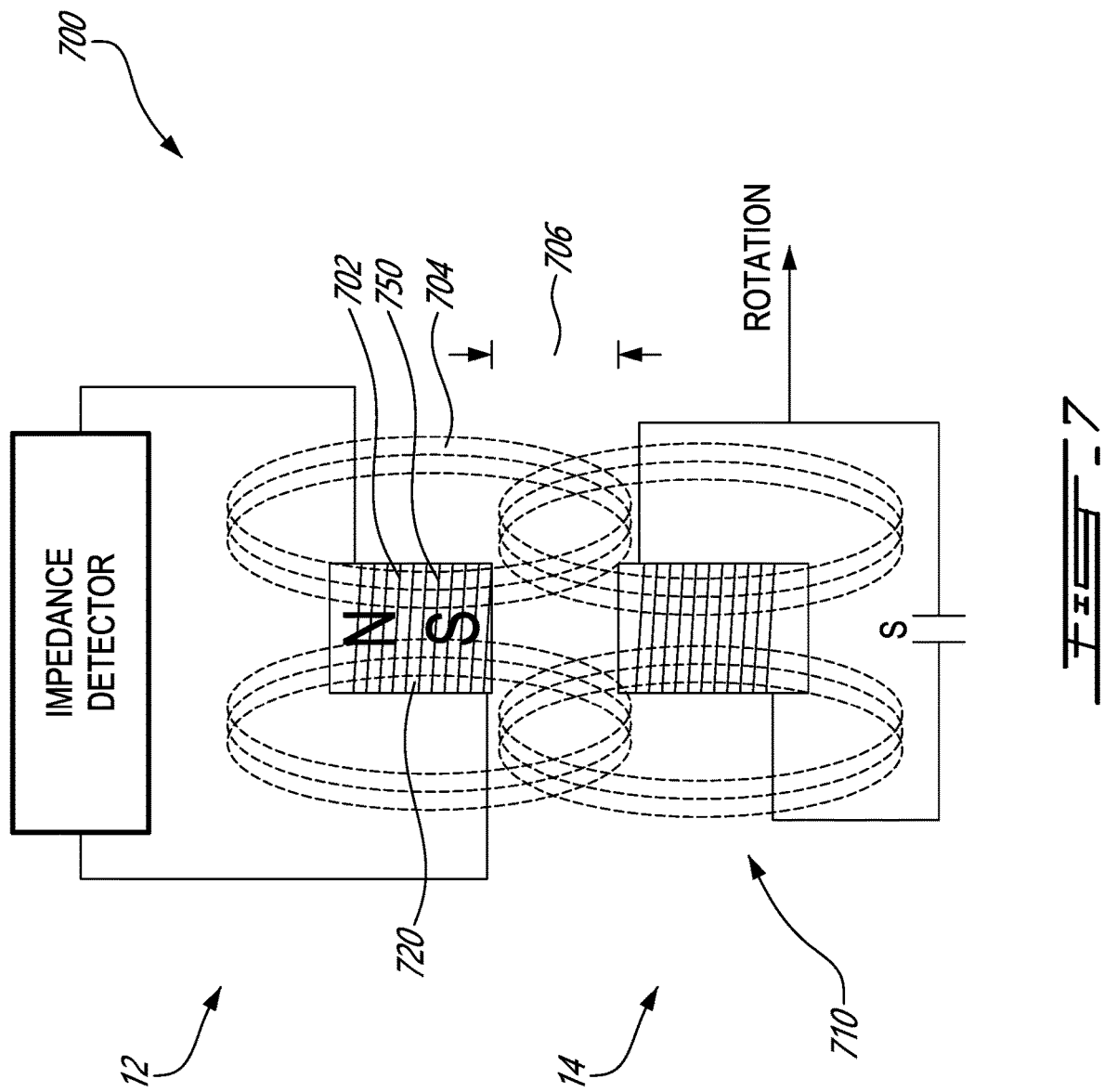
FIG. 7 is a schematic view of an example of an apparatus for detecting a leak in a Kaplan-type turbine, showing another example of a magnetic field source, in accordance with one or more embodiments.

FIG. 7 shows another example of an apparatus 700 for detecting a leak in a turbine 10 having a stator 12, a rotor 14 rotatably coupled to the stator 12 and spaced-apart therefrom by a gap. As illustrated, the apparatus 700 has a magnetic field source 702 which is mounted to the stator 12 and which transmits a magnetic field 704 across a gap 706 between the stator 12 and the rotor 14. In this specific example, the magnetic field source 702 includes a permanent magnet 750 whose polarity defines the magnetic field 704. As inductive and capacitive responses of a circuit driven by a DC source may be appreciated only when the DC source is turn on or off, the rotation of the rotor 14 with respect to the stator 12 may be perceived from the interrogation circuit 710 as if the permanent magnet 750 is successively turned on or off. As such, inductive and capacitive responses caused by the interaction of the permittivity of the liquid-filled spacing S between the electrical contacts 716 may be detected by the detection circuit 720. Indeed, in this example, the detection circuit 720 has a stator-side coil 722 which is independent from the magnetic field source 702. In some embodiments, the permanent magnet 750 may be substituted by a DC source. In such embodiments, the magnetic field source 702 does not require a coil, and the coil 722 would pertain to the detection circuit 710 alone.

Figure 8:
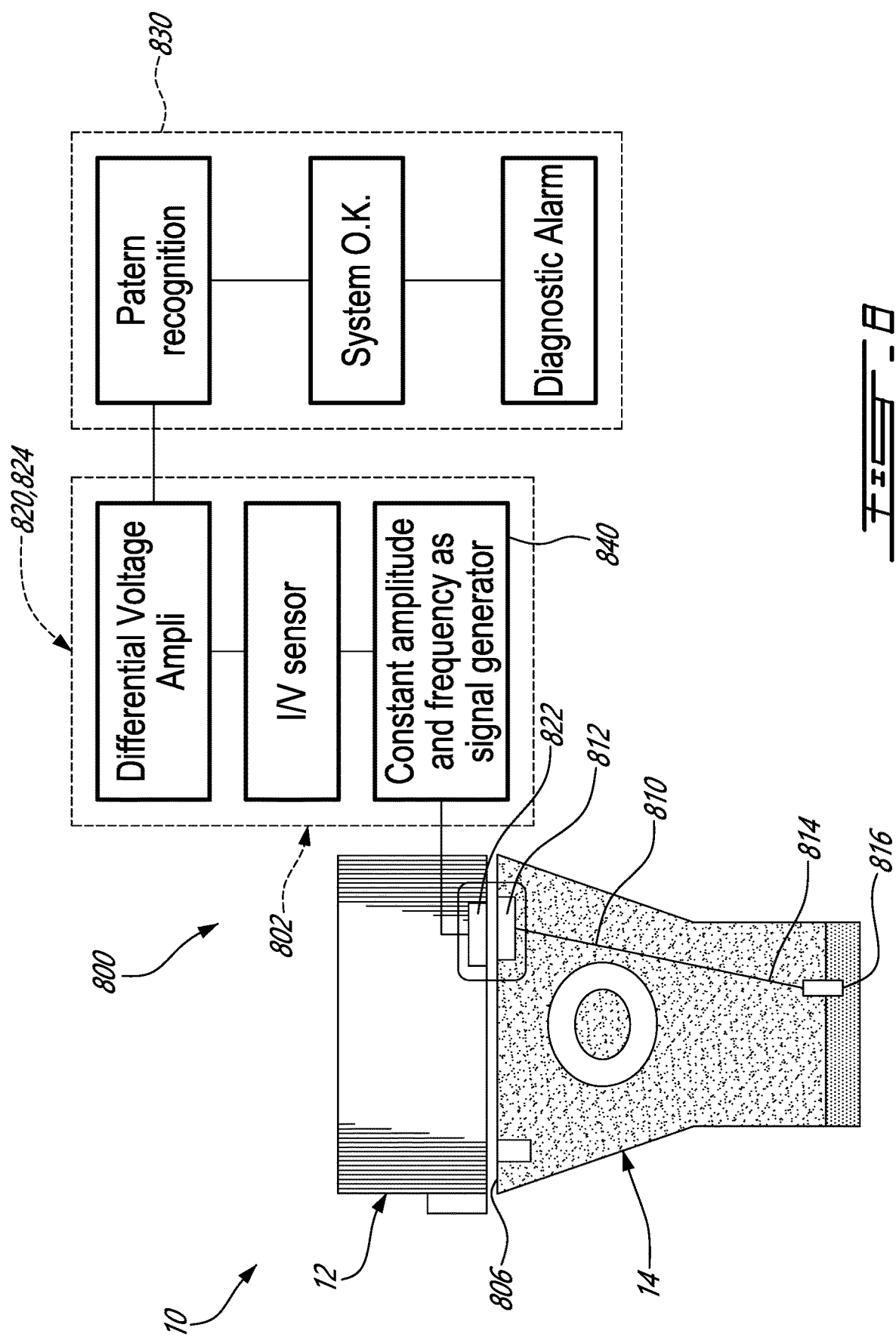
FIG. 8 is a schematic view of another example of an apparatus for detecting a leak in a Kaplan-type turbine, showing an example of a detection circuit, in accordance with one or more embodiments.

FIG. 8 shows an example of an apparatus 800 for detecting a leak in a turbine 10 having a stator 12, a rotor 14 rotatably coupled to the stator 12 and spaced-apart therefrom by a gap 806.

As shown, the apparatus 800 has a magnetic field source 802 mounted to the stator 12 and transmitting a magnetic field across the gap 806 between the stator 12 and the rotor 14.

The apparatus 800 has an interrogation circuit 810 mounted to the rotor 14 and having a rotor-side coil 812 magnetically coupled to the magnetic field source 802 across the gap 806 via the magnetic field 804, and a distal circuit portion 814 having electrical contacts 816 separated by a spacing S filled with a liquid in the rotor 14 during normal operating conditions.

As shown, the apparatus 800 has a detection circuit 820 mounted to the stator 12 and having a stator-side coil 822 magnetically coupled to the magnetic field 804 and an impedance detector 824 detecting a variation of impedance occurring in the detection circuit 820 upon change of a permittivity of the liquid across the spacing S.

The apparatus 800 can act as a water intrusion monitoring system comprises electrical contacts 816, such as conductive plates 816, installed inside at the bottom of the rotor 14, and wired to bring the signal to the rotor-side coil 812 acting as a transmitter passing in front of the stator-side coil 822 inline with its rotating path. The stator-side coil 822, a fixed part of the apparatus 800, is connected to a constant frequency and voltage power supply 840. The current amplitude is measured, and processed by a controller 830 to confirm good operating condition and generate an alarm should water be detected at the bottom of the rotor 14.

Figure 9:
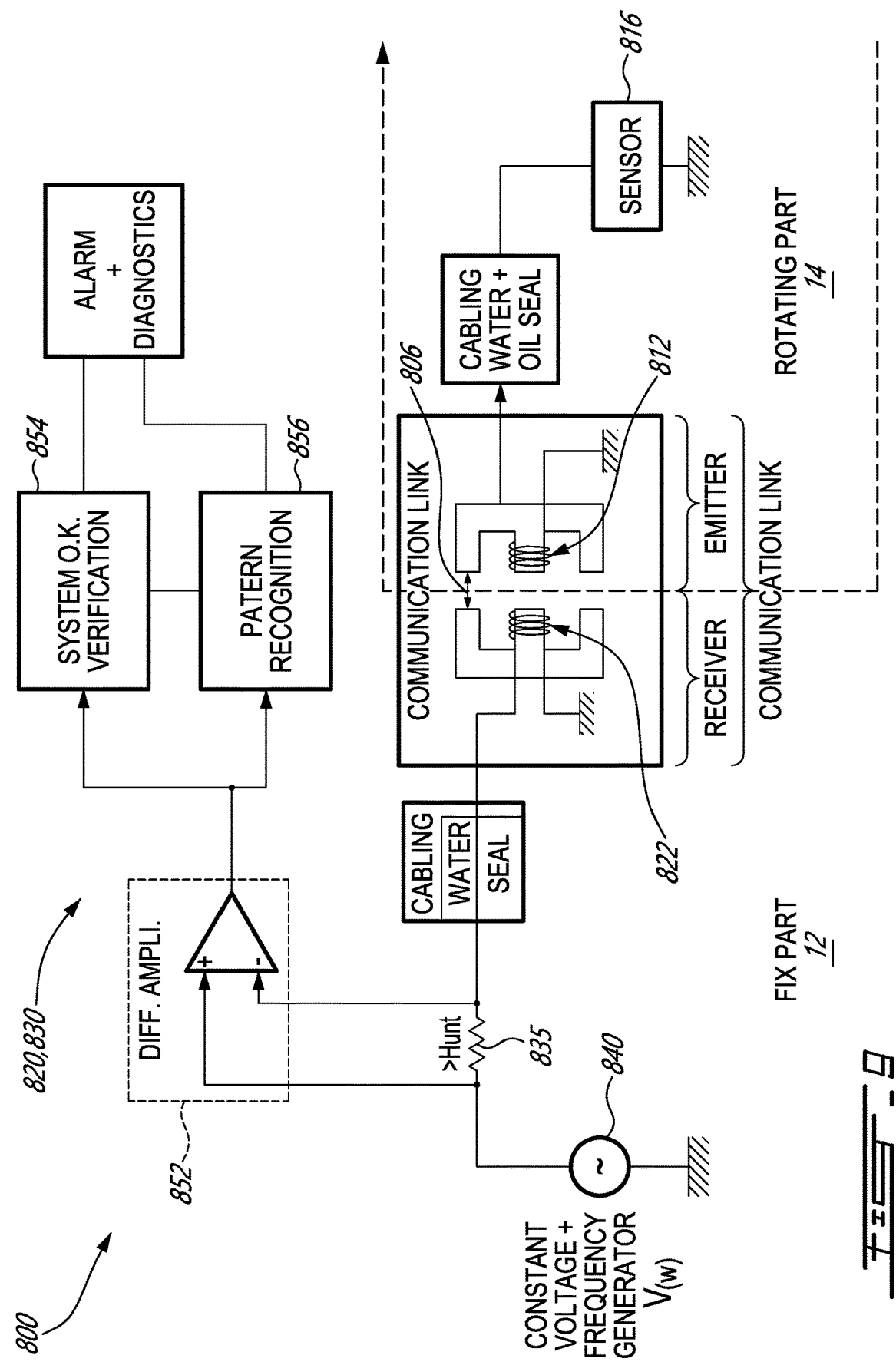
FIG. 9 is a detailed view of the apparatus of FIG. 8, in accordance with one or more embodiments.

FIG. 9 shows an electronic circuit diagram of the apparatus 800 of FIG. 8. As shown, a constant voltage and frequency generator 840 is sending a signal through a shunt resistor 835 to the stator-side coil 822, and the rotor-side coil 812 then reacts to the constant voltage and frequency generator 840 through a magnetic field at each passage in front of the stator-side coil 822. As such, the coils 812 and 822 act as a transformer in this embodiment. The current circulated through the shunt 835 generates a voltage measured by a differential amplifier 852 which is then processed by the controller 830. In some embodiments, the controller 830 can have a diagnostic module 854 configured for outputting a diagnostic on whether a leak has been detected, and if yes, its degree of severity. In some embodiments, the controller 830 can have a pattern recognition module 856 recognizing whether the electrical contacts 816 are surrounded by oil or water, with the measured value representing the current sent by the constant voltage and frequency generator 840. Such current being representative of magnetization or induced current.

If the electrical contacts 816 are surrounded by oil, the magnetic link becomes a transformer facing a high impedance and the current is lower. On the contrary, if the electrical contacts 816 are surrounded by water, the magnetic link becomes a transformer facing a low impedance and the current is much higher, i.e., equal to the sum of the magnetization plus the load current reflected thanks to the low impedance at the secondary of the transformer. Then, upon determining that the rotor 14 is in acceptable operating conditions, the diagnostic module 854 may send a signal to generate an alarm. Note that the resulting performance of the transformer is weakened due to the gap 806 needed as a clearance to avoid destroying the transformer pieces meaning when stator-side coil 822 crosses the rotor-side coil 812 at every turn.

The apparatus 800 provides information about the situation at the sensor position in the rotor 14. In the case of water in oil, the pattern recognition is simplified due to the high change in impedance. The oil is seen as an open circuit while the water is seen as an almost short-circuit. For that reason, the water environment signal is higher than the distant current amplitude (DWCA). Explanation is that the DWCA is limited by the impedance of the inductance reflected from the rotor-side coil 812 around the core which has an important part in the air still less than into water conditions while the reflected impedance during the crossing of the rotor-side coil 812 in front of the stator-side coil 822 is generating an easier path for the magnetic flux. Such feedback increases the inductance value showing a higher impedance, lowering the measured current. When the rotor-side coil 812 is perfectly in line with the stator-side coil 822, the magnetic circuit acts as a transformer with a defected core because of the air gap but it is enough to see the difference between different impedances. As previously mentioned, the case of water and oil is simplified because of the extreme current changes or impedances which are close to zero ohm or very high like an open circuit. The results from intermediary impedances are also to be considered. The intermediary values from an impedance sensitive sensor such as capacitance can be applied to analyze impurity content or any other sensor with an impedance sensitive reaction. The analysis in such a situation resides in the pattern recognition which is being defined and memorized to be used as a real time diagnostic and alarm when compared to real time measures.

Figure 10:
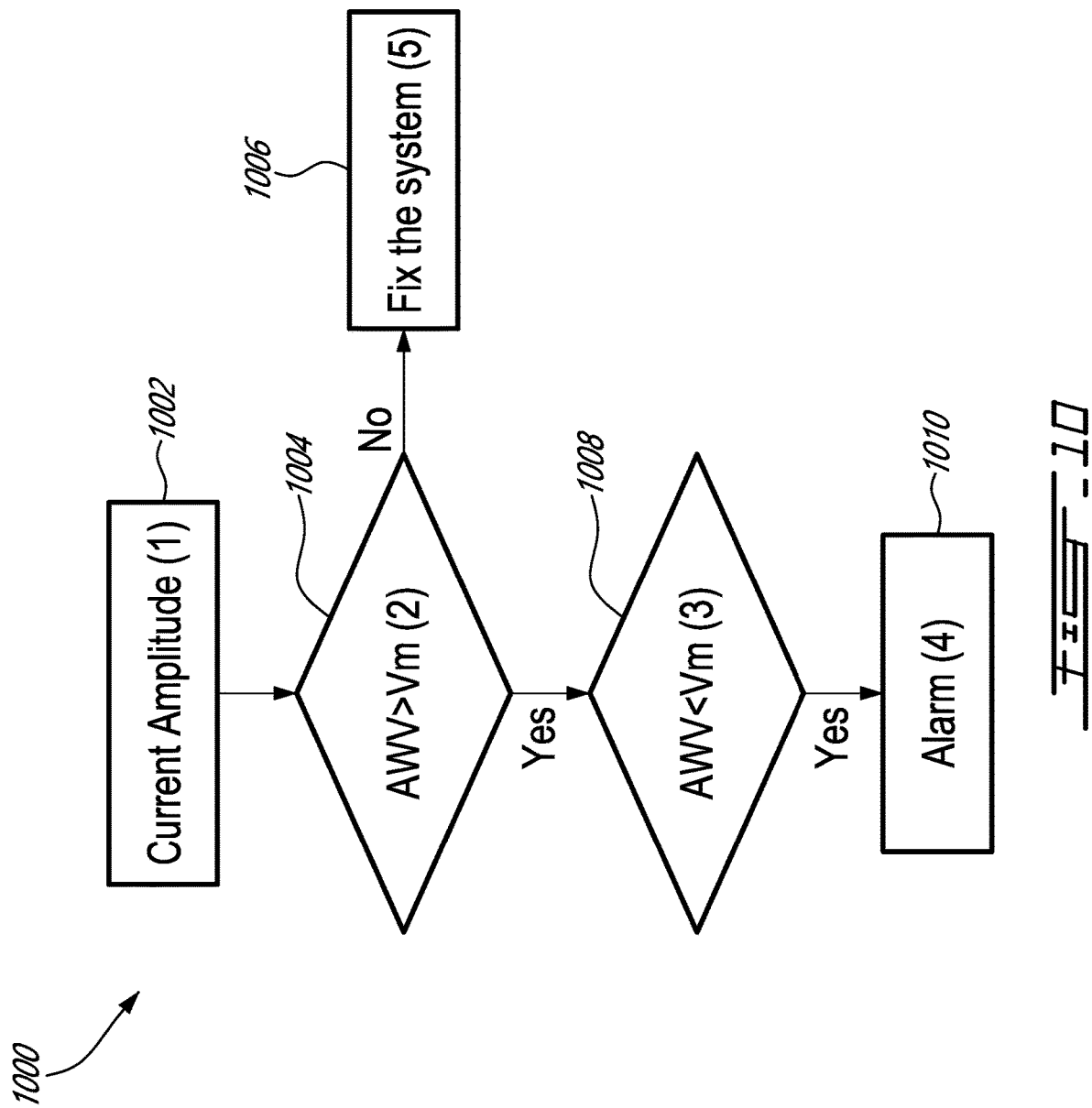
FIG. 10 is a block diagram showing steps performed depending on a measured impedance value, in accordance with one or more embodiments.

In some embodiments, following the block diagram 1000 of FIG. 10, an amplitude of the current circulating through the detector circuit 820 is measured at step 1002. The measured current amplitude is compared to the DWCA at comparing step 1004. If the measured current amplitude is below the DWCA, an alarm is sent to indicate that the rotor 14 requires maintenance. The comparing step 1008 measures if the measured current amplitude gets higher than the DWCA. If not, no actions taken. If yes, an alarm is generated. If the comparing step 1004 does not see the real time current amplitude lowering at that time, the system is warned to fix it. This can be referred as an OK system indicating that the system operates under normal conditions.

Figure 11:
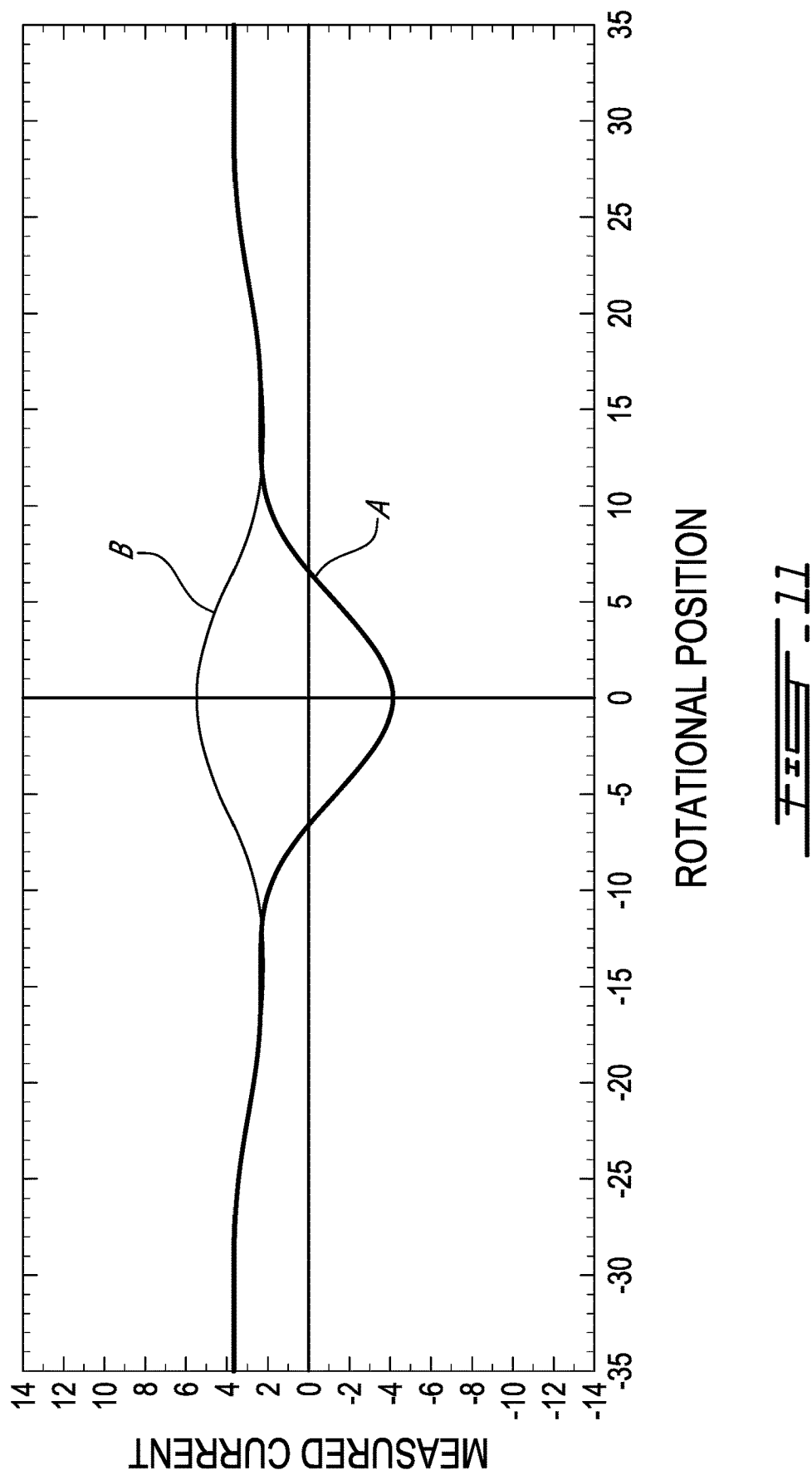
FIG. 11 is a graph showing variation of impedance as a function of rotational position of the rotary fluid reservoir as acquired using the apparatus of FIG. 8, in accordance with one or more embodiments.

FIG. 11 is showing experimental results depending on the water content in an oil filled rotating container; meaning with or without water infiltration, for an air gap of 2 mm between the rotor and the stator. Based on the results, pattern recognition is to be considered. The graphs show the measured current amplitude as a function of rotational position of the rotor relative to the stator, as can be measured using encoder-decoder elements positioned on either one of both of the stator and the rotor. As the rotating coil is crossing the fixed one, the current amplitude is measured and recorded for further analysis. The result is different and depends on the sensor liquid surrounding it. For example, in the case of oil and water, the two extremes are the curve A showing a pure oil environment situation while the curve B is for the sensor covered with water. The case shown in FIG. 11 is an for intermediary situation, i.e., when the liquid filling the spacing S is a combination of water and oil. Changing the reflected impedance allows sending different messages. The application could be to monitor different levels of water which indicates different water levels over time and informing about the trend or severity of a water infiltration.

As can be noted, when the rotor-side coil of the apparatus is away from the fixed one, the current level is the same and independent of the different monitoring sensor situations. This is a way to assess the operating conditions of the turbine, in some embodiments. Typical air gap would be 5 mm to which we add 2 mm each side as a water sealant protection. All underwater pieces like the cabling, the rotor-side coil and the stator-side coil have to be high-pressure water sealed and protected since the preferred embodiment environment is the one of a hydropower turbine.

As seen in those FIG. 11, the stator-side coil current gets lower when the rotor-side coil starts crossing the stator-side coil to get higher, back to its distant current amplitude (DWCA). The difference is linked to the sensor response depending on its surrounding liquid. In the case of water oil situation, two situations are possible: if the liquid is oil, the response at the receiver is such that current is of lower amplitude than the DWCA for whatever the air gap; and if the liquid is water, the DWCA is the same while the receiver's current amplitude is going lower at the beginning of its crossing with the emitter to get even higher than the DWCA and lower again than the DWCA to reach the DWCA again when they are away from one another.

The observation that the signal is always coming down during the crossing process, even in the case of water is used to assess the good operating condition of the system.

In view of the results shown in FIG. 11, one can appreciate that the patterns of variation of impedance values or the patterns of variation of current values monitored by the detection circuit can be analyzed to determine whether oil or water is present between the electrical contacts of the interrogation circuit. In some embodiments, the controller can compare the measured patterns to calibration data in the analysis. For instance, if it is determined that the pattern of measured values, e.g., measured impedance or current values, corresponds to a reference pattern generally associated with water or oil, then the corresponding determination can be made. In some other embodiments, only the values measured as the interrogation and detection circuits face each other are used in the determination. In some other embodiments, values measured elsewhere, e.g., when the interrogation and detection circuits are away from one another, may be used to confirm whether the rotor is functioning properly.

FIG. 12 shows another example of an apparatus 1200 for assessing integrity of a Kaplan-type turbine having a stator 12 and a rotor 14. As shown, the apparatus 1200 has a magnetic field source 1202 mounted to the stator 12 and transmitting a magnetic field 1204 across a gap 1206 between the stator 12 and the rotor 14. The apparatus 1200 also has an interrogation circuit 1210 mounted to the rotor 14 and having a coil 1212 magnetically coupled to the magnetic field source 1202 across the gap 1206 via the magnetic field 1204. As shown, the interrogation circuit 1210 has a distal circuit portion 1214 having electrical contacts 1216 separated by a spacing S fluidly communicating with the turbine's cavity. As discussed above, the interrogation circuit 1210 is configured for influencing the magnetic field 1204 when a change in an impedance of the cavity's liquid L occurs in the spacing S. A detection circuit 1220 is also provided on the stator 12. The detection circuit 1220 has a coil 1222 electromagnetically coupled to the magnetic field 1204 and a detector 1224 configured for detecting the influence of the interrogation circuit 1210 on the magnetic field 1204.

As depicted, the interrogation circuit 1210 has a sensor unit 1260 being communicatively coupled to the coil 1212 thereof. More specifically, in this specific embodiment, the interrogation circuit 1210 has two conductive surfaces 1216' close to each other and separated by the liquid when the sensor unit 1260 is immersed into the liquid L. The conductive surfaces 1216' act as the electrical contacts 1216. As shown, the interrogation circuit 1210 is provided with a first electrical conductor 1262 connecting the coil 1212 to a first one of the electrical contacts 1216 and a second electrical conductor 1264 connecting a second one of the electrical contacts 1216 to another end of the coil 1212. In this embodiment, the second electrical conductor 1264 is grounded. It was found convenient to provide a first resistor 1266 connected in series between the first electrical conductor 1262 and the first one of the electrical contacts 1216, and a second resistor 1268 connected in parallel to the two electrical contacts 1216. The first and second resistors 1266 and 1268 preferably have differing nominal resistance values R. For instance, the first resistor 1266 has a first nominal resistance value R1 and the second resistor 1268 has a second nominal resistance value R2 which is greater than the first nominal resistance value R1, i.e., R2>R1. In this specific embodiment, the first nominal resistance value R1 is about 50 ohms and the second nominal resistance value R2 is about 390 ohms. However, other values for the first and second nominal resistance values R1 and R2 can be used in some other embodiments. For instance, the first and second nominal resistance values R1 and R2 can be similar to one another, or the second nominal resistance value R2 may be smaller than the first nominal resistance value R1, depending on the embodiment. Other resistor may be connected in series or in parallel at other positions of the interrogation circuit 1210. Turning now to FIGS. 13A and 13B, an example of the sensor unit 1260 is shown. As can be appreciated, the sensor unit 1260 has electrical contacts 1216 provided in the form of complementarily shaped conducting surfaces 1216' which lie is a common plane P and which are separated by a spacing S running around the plane in a closed loop. By removably fixing the sensor unit 1260 to an inside wall W of a turbine using a conductive nut and bolt assembly 1270, one of the two conducting surfaces 1216' may be grounded, as shown in this example. A casing 1272 may be providing support for exposed the two conducting surfaces 1216' to the external environment. The casing 1272 may also be convenient to enclose either one or both of the first and second resistors 1266 and 1268 discussed above.

Figure 14:
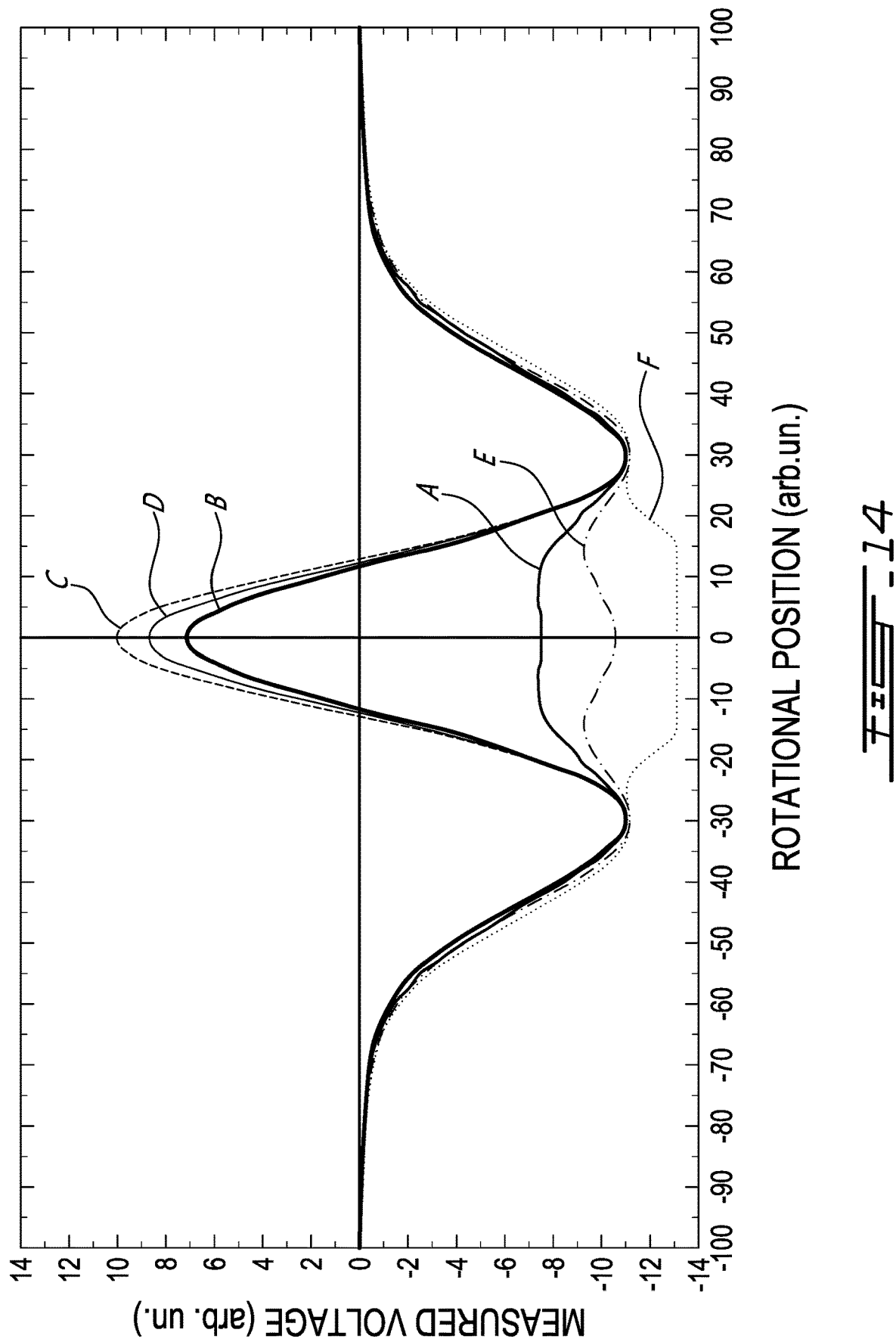
FIG. 14 is a graph showing variation of impedance as a function of rotational position of the rotary fluid reservoir as acquired using the apparatus of FIG. 12, in accordance with one or more embodiments.

As emphasized in FIG. 14, showing curves representing the measured influence of the interrogation circuit on the magnetic field in several situations, having resistors of different nominal resistance values may help is identifying a malfunction's origin. For instance, during normal operation of the interrogation circuit, typical measured curves may look like curve A and curve B. Curve A is indicative that oil fills the spacing between the electrical contacts, and that thereby no leak is detected. Curve B is indicative that water at least partially fills the spacing between the electrical contacts, and is thereby indicative of a water leak. Detecting curve B may trigger an alert. It was found that by providing the first and second resistors, other curves could be detected in some other situations which can help in identifying scenarios which differ from the no-leak and leak scenarios indicated by curves A and B. For instance, should a short circuit occur proximate the coil, a curve such as curve C can be measured; should a short circuit occur proximate the sensor unit, a curve such as curve D can be measured; should there be no electrical conductors connected to the coil, a curve such as curve E could be measured; and/or should the first and second electrical conductors be connector to the coil but not to the sensor unit, a curve such as curve F can be measured. Such curves can be obtained using polarizing impedances as a way to continuously assess the good functioning of the apparatus. The environment surrounding the apparatus is very tough so detecting malfunction, and more specifically the malfunction's origin, is desirable in at least some embodiments. Other curves may be obtained in situations depending on the configuration of resistor(s) positioned in the interrogation circuit. Accordingly, the apparatus can be provided with a computing device being configured to perform influence pattern recognition and generate alerts based on the recognized influence pattern. For instance, the computing device can compare the measured influence, e.g., the variation of impedance, current and/or voltage, to corresponding reference influence patterns stored on an accessible memory system. By matching the measured influence to a corresponding one of the reference influence patterns, a signal associated with the matched one of the reference influence patterns can be generated. In some embodiments, a label is associated with each one of the reference influence patterns. In these embodiments, the signal can be indicative of the label. For instance, by matching the measured influence to reference influence pattern or curve C, the signal can be indicative that a short-circuit is present proximate the coil, for instance. In some embodiments, adding other resistors and the like may help identify other types of malfunction.

As can be understood, the examples described above and illustrated are intended to be exemplary only. It will be noted that in the embodiments presented above, the magnetic coupling between the magnetic field source and the interrogation circuit, can be intermittent, and occur only when the rotation of the rotor relative to the stator results in circumferential alignment of the interrogation coil with the magnet (electro-magnet or permanent magnet). This is the case when the interrogation coil and the magnet are axially spaced-apart from the rotor's axis, at a common axial distance. In some embodiments, it may be feasible to configure the system in a manner for the magnetic field source to be permanently coupled to the interrogation coil, such as by mounting the magnet and the interrogation coil co-axially with the rotor's rotation axis. For instance, in some other embodiments, the apparatus and method described herein can be used to detect any type of fluid such as gas or liquid. In some embodiments, the apparatus can be operated in a dynamic mode involving CC current which can thereby allow measurement to be made when the turbine rotates at only a minimal speed. The scope is indicated by the appended claims.

What is claimed is:

1. An electric machine comprising:
   a stator,
   a rotor rotatably coupled to said stator and having an internal cavity,
   a magnetic field source mounted to said stator and transmitting a magnetic field across a gap between said stator and said rotor;
   an interrogation circuit mounted to said rotor and having a coil magnetically coupled to said magnetic field source across said gap via said magnetic field, and a distal circuit portion having electrical contacts separated by a spacing fluidly communicating with the cavity, the interrogation circuit configured for influencing the magnetic field when a change in an impedance of said liquid occurs in the spacing; and
   a detection circuit mounted to said stator, the detection circuit having a coil electromagnetically coupled to said magnetic field and a detector configured for detecting the influence of the interrogation circuit on the magnetic field;
   wherein the rotor has a hollow body delimiting the internal cavity, a plurality of circular openings circumferentially distributed around said hollow body, and a corresponding plurality of blades rotatably mounted within said circular openings to rotate individually about a center of said circular openings for pitch variability, the internal cavity being filled with liquid.

2. The electric machine of claim 1 wherein said magnetic field source has an alternating electrical source driving said coil of said detection circuit.

3. The electric machine of claim 1 wherein said magnetic field source has a permanent magnet, the coil of the detection circuit being coiled around a magnetic field axis of the permanent magnet.

4. The electric machine of claim 1 wherein said electrical contacts are provided in the form of two conductive plates facing each other and spaced by said spacing.

5. The electric machine of claim 1 wherein said coils of said interrogation and detection circuits are axially spaced-apart from a rotation axis of said rotor and become circumferentially aligned with each other across said gap at a given relative rotational position between the rotor and the stator, wherein said electromagnetic coupling occurs when the coils approach, reach, and depart from the circumferential alignment due to the rotation of the rotor.

6. An electric machine comprising:
a stator,
a rotor rotatably coupled to said stator and having an internal cavity,
a magnetic field source mounted to said stator and transmitting a magnetic field across a gap between said stator and said rotor;
an interrogation circuit mounted to said rotor and having a coil magnetically coupled to said magnetic field source across said gap via said magnetic field, and a distal circuit portion having electrical contacts separated by a spacing fluidly communicating with the cavity, the interrogation circuit configured for influencing the magnetic field when a change in an impedance of said liquid occurs in the spacing; and
a detection circuit mounted to said stator, the detection circuit having a coil electromagnetically coupled to said magnetic field and a detector configured for detecting the influence of the interrogation circuit on the magnetic field;
wherein said interrogation circuit is a first interrogation circuit, said electric machine comprising a second interrogation circuit having a distal circuit portion being positioned at a depth within said internal cavity different than a depth of said distal circuit portion of said first interrogation circuit.

7. An electric machine comprising:
a stator,
a rotor rotatably coupled to said stator and having an internal cavity,
a magnetic field source mounted to said stator and transmitting a magnetic field across a gap between said stator and said rotor;
an interrogation circuit mounted to said rotor and having a coil magnetically coupled to said magnetic field source across said gap via said magnetic field, and a distal circuit portion having electrical contacts separated by a spacing fluidly communicating with the cavity, the interrogation circuit configured for influencing the magnetic field when a change in an impedance of said liquid occurs in the spacing; and
a detection circuit mounted to said stator, the detection circuit having a coil electromagnetically coupled to said magnetic field and a detector configured for detecting the influence of the interrogation circuit on the magnetic field;
further comprising a controller having a processor and a memory having stored thereon instructions that when executed by said processor perform the step of: generating an alert upon determining that said detected influence is a variation of impedance of at least 10 percent.

8. The electric machine of claim 7 wherein the instructions when executed by said processor perform the step of: generating an alert upon determining that said detected influence is a variation of impedance of at least 25 percent.

9. An electric machine comprising:
a stator,
a rotor rotatably coupled to said stator and having an internal cavity,
a magnetic field source mounted to said stator and transmitting a magnetic field across a gap between said stator and said rotor;
an interrogation circuit mounted to said rotor and having a coil magnetically coupled to said magnetic field source across said gap via said magnetic field, and a distal circuit portion having electrical contacts separated by a spacing fluidly communicating with the cavity, the interrogation circuit configured for influencing the magnetic field when a change in an impedance of said liquid occurs in the spacing; and
a detection circuit mounted to said stator, the detection circuit having a coil electromagnetically coupled to said magnetic field and a detector configured for detecting the influence of the interrogation circuit on the magnetic field;
wherein said interrogation circuit has a first resistor connected in series between an electrical conductor and a first one of the of the electrical contacts, and a second resistor connected in parallel to the electrical contacts.

10. The electric machine of claim 9 wherein said first resistor has a first nominal resistance value and the second resistor has a second nominal resistance value being greater than the first nominal resistance value.

11. The electric machine of claim 10 wherein the first nominal resistance value is about 50 ohms and the second nominal resistance value is about 390 ohms.

12. An electric machine comprising:
a stator,
a rotor rotatably coupled to said stator and having an internal cavity,
a magnetic field source mounted to said stator and transmitting a magnetic field across a gap between said stator and said rotor;
an interrogation circuit mounted to said rotor and having a coil magnetically coupled to said magnetic field source across said gap via said magnetic field, and a distal circuit portion having electrical contacts separated by a spacing fluidly communicating with the cavity, the interrogation circuit configured for influencing the magnetic field when a change in an impedance of said liquid occurs in the spacing; and
a detection circuit mounted to said stator, the detection circuit having a coil electromagnetically coupled to said magnetic field and a detector configured for detecting the influence of the interrogation circuit on the magnetic field;
wherein said coils of said interrogation and detection circuits are axially spaced-apart from a rotation axis of said rotor and become circumferentially aligned with each other across said gap at a given relative rotational position between the rotor and the stator, wherein said electromagnetic coupling occurs when the coils approach, reach, and depart from the circumferential alignment due to the rotation of the rotor;
further comprising a controller having a processor and a memory having stored thereon instructions that when executed by said processor perform the step of: monitoring the electrical condition of the detection circuit when the coils are circumferentially misaligned from one another for influences indicative of malfunction.

13. A method for detecting a liquid contaminant in an internal cavity of a hollow housing rotatably mounted to a base, said method comprising:
- transmitting a magnetic field across a gap between said base and said hollow housing;
- said magnetic field driving a coil in said internal cavity and circulating a current into an interrogation circuit having electrical contacts coupled to said coil and separated from one another by a spacing fluidly communicating with said internal cavity, the interrogation circuit influencing said magnetic field when a change in an impedance occurs in said spacing; and
- using a detection circuit mounted to said base and having a coil electromagnetically coupled to said magnetic field, detecting said influence of said interrogation circuit on said magnetic field;
- further comprising, using a controller, generating an alert upon determining that said influence occurring in said detection circuit is a variation of impedance of at least 10 percent.

14. The method of claim 13 wherein said transmitting a magnetic field includes driving an alternating current across said coil of said base.

15. The method of claim 13 wherein said transmitting a magnetic field includes mounting a permanent magnet to said base and proximate to said gap, the coil of the detection circuit being coiled around a magnetic field axis of the permanent magnet.

16. The method of claim 13 wherein said alert indicates that said liquid has changed from a first liquid to a second liquid upon determining that said variation of impedance is above a predetermined threshold.

17. The method of claim 13 wherein said interrogating and said detecting are performed as the rotary fluid reservoir rotates and when said coils of said interrogation and detection circuits become circumferentially aligned with each other across said gap at a given relative rotational position between said base and said rotary fluid reservoir.

18. The method of claim 13 wherein said generating an alert is performed upon determining that said influence occurring in said detection circuit is a variation of impedance of at least 25 percent.

19. A method for detecting a liquid contaminant in an internal cavity of a hollow housing rotatably mounted to a base, said method comprising:
- transmitting a magnetic field across a gap between said base and said hollow housing;
- said magnetic field driving a coil in said internal cavity and circulating a current into an interrogation circuit having electrical contacts coupled to said coil and separated from one another by a spacing fluidly communicating with said internal cavity, the interrogation circuit influencing said magnetic field when a change in an impedance occurs in said spacing; and
- using a detection circuit mounted to said base and having a coil electromagnetically coupled to said magnetic field, detecting said influence of said interrogation circuit on said magnetic field;
- further comprising, using a controller, matching a pattern of said detected influence to one of a plurality of reference influence patterns, and generating a signal associated with the matched one of the reference influence patterns.

\* \* \* \* \*